United States Patent
Salowe et al.

(10) Patent No.: US 9,183,343 B1
(45) Date of Patent: Nov. 10, 2015

(54) METHODS, SYSTEMS, AND ARTICLES OF MANUFACTURE FOR IMPLEMENTING HIGH CURRENT CARRYING INTERCONNECTS IN ELECTRONIC DESIGNS

(71) Applicant: Cadence Design Systems, Inc., San Jose, CA (US)

(72) Inventors: Jeffrey S. Salowe, Los Gatos, CA (US); Viral Mankad, San Jose, CA (US); Supriya Ananthram, Los Gatos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/705,164

(22) Filed: Dec. 4, 2012

(51) Int. Cl.
G06F 17/50 (2006.01)

(52) U.S. Cl.
CPC .................................. G06F 17/5077 (2013.01)

(58) Field of Classification Search
CPC G06F 17/5068; G06F 17/5077; G06F 17/504
USPC .......................... 716/126, 129–130, 132, 136
See application file for complete search history.

(56) References Cited

U.S. PATENT DOCUMENTS

| | | | | |
|---|---|---|---|---|
| 4,484,292 A * | 11/1984 | Hong et al. | .................... | 716/129 |
| 4,811,237 A * | 3/1989 | Putatunda et al. | ............ | 716/127 |
| 5,535,134 A * | 7/1996 | Cohn et al. | ..................... | 716/112 |
| 5,644,500 A * | 7/1997 | Miura et al. | ................... | 716/120 |
| 5,770,481 A | 6/1998 | Fujii | | |
| 6,011,912 A * | 1/2000 | Yui et al. | ........................ | 716/122 |
| 6,298,468 B1 * | 10/2001 | Zhen | .............................. | 716/122 |
| 6,324,675 B1 | 11/2001 | Dutta et al. | | |
| 6,349,403 B1 * | 2/2002 | Dutta et al. | .................... | 716/129 |
| 6,407,434 B1 * | 6/2002 | Rostoker et al. | .............. | 257/401 |
| 6,490,713 B2 * | 12/2002 | Matsumoto | .................... | 716/129 |
| 6,505,333 B1 | 1/2003 | Tanaka | | |
| 6,543,041 B1 * | 4/2003 | Scheffer et al. | ............... | 716/112 |
| 6,557,145 B2 * | 4/2003 | Boyle et al. | .................... | 716/105 |
| 6,763,512 B2 | 7/2004 | Xing | | |
| 6,769,105 B1 | 7/2004 | Teig et al. | | |
| 6,851,100 B1 * | 2/2005 | You et al. | ....................... | 700/121 |
| 6,892,371 B1 | 5/2005 | Teig et al. | | |

(Continued)

OTHER PUBLICATIONS

Non-Final Office Action dated Sep. 19, 2013 for U.S. Appl. No. 13/602,071.

(Continued)

*Primary Examiner* — Naum Levin
(74) *Attorney, Agent, or Firm* — Vista IP Law Group, LLP

(57) ABSTRACT

Various embodiments implement high current carrying multi-strands of interconnects between two pins in a region of interest within an electronic circuit by performing area-based searches for viable routing solutions using valid intervals. Certain pins that are within a predetermined proximity to each other may be optionally clustered to form a single, wide pin. The region of interest may be first processed to form one or more sets of spacetiles, or the geometries in the region of interest may be projected onto a boundary of the region of interest, to determine the valid interval(s) on along the boundary. The valid intervals may then be used by a router to implement the multi-strands of interconnects. The router also considers the physical, electrical, and manufacturing requirement(s) in implementing the multi-strands of interconnects.

29 Claims, 24 Drawing Sheets

(56) References Cited

U.S. PATENT DOCUMENTS

| | | | |
|---|---|---|---|
| 6,938,234 | B1 | 8/2005 | Teig et al. |
| 6,957,407 | B2 * | 10/2005 | Suto .............................. 716/130 |
| 6,957,411 | B1 | 10/2005 | Teig et al. |
| 6,981,235 | B1 | 12/2005 | Salowe et al. |
| 6,996,512 | B2 * | 2/2006 | Alpert et al. ..................... 703/14 |
| 7,016,794 | B2 * | 3/2006 | Schultz ........................... 702/64 |
| 7,051,313 | B1 * | 5/2006 | Betz et al. ...................... 716/113 |
| 7,076,750 | B1 * | 7/2006 | Lukanc ........................... 716/52 |
| 7,089,526 | B1 * | 8/2006 | Salowe et al. ................. 716/129 |
| 7,096,445 | B1 | 8/2006 | Pucci et al. |
| 7,100,128 | B1 | 8/2006 | Nequist et al. |
| 7,107,564 | B1 | 9/2006 | Teig et al. |
| 7,117,468 | B1 | 10/2006 | Teig et al. |
| 7,222,322 | B1 | 5/2007 | Chyan |
| 7,257,797 | B1 * | 8/2007 | Waller et al. ................... 716/122 |
| 7,363,607 | B2 * | 4/2008 | Birch et al. .................... 716/113 |
| 7,516,433 | B1 | 4/2009 | Pucci et al. |
| 7,523,430 | B1 * | 4/2009 | Patel .............................. 716/115 |
| 7,594,214 | B1 * | 9/2009 | Salowe et al. .................. 716/119 |
| 7,694,261 | B1 | 4/2010 | Chyan et al. |
| 7,752,590 | B1 | 7/2010 | Chyan et al. |
| 7,802,208 | B1 * | 9/2010 | Waller et al. ................... 716/115 |
| 7,890,909 | B2 | 2/2011 | Pyapali et al. |
| 7,934,177 | B2 | 4/2011 | Shin |
| 7,958,480 | B1 * | 6/2011 | Slonim et al. .................. 716/118 |
| 8,006,216 | B1 * | 8/2011 | Chen et al. ..................... 716/126 |
| 8,028,253 | B2 | 9/2011 | Drapeau |
| 8,239,806 | B2 | 8/2012 | Chen et al. |
| 8,375,348 | B1 * | 2/2013 | Raj et al. ........................ 716/126 |
| 8,418,110 | B2 * | 4/2013 | Keinert et al. ................. 716/126 |
| 8,495,549 | B2 | 7/2013 | Maruyama et al. |
| 8,510,703 | B1 | 8/2013 | Wadland et al. |
| 8,560,998 | B1 | 10/2013 | Salowe et al. |
| 8,671,368 | B1 | 3/2014 | Salowe et al. |
| 8,769,455 | B1 | 7/2014 | Singh et al. |
| 2001/0038612 | A1 | 11/2001 | Vaughn |
| 2003/0014201 | A1 * | 1/2003 | Schultz ........................... 702/64 |
| 2003/0126578 | A1 | 7/2003 | Wadland et al. |
| 2006/0288323 | A1 * | 12/2006 | Birch .............................. 716/12 |
| 2007/0101303 | A1 | 5/2007 | Lien |
| 2007/0106969 | A1 | 5/2007 | Birch et al. |
| 2007/0162884 | A1 | 7/2007 | Matsuno et al. |
| 2008/0072182 | A1 * | 3/2008 | He et al. ............................ 716/2 |
| 2008/0244504 | A1 | 10/2008 | Drapeau |
| 2009/0055792 | A1 | 2/2009 | Itagaki |
| 2009/0144688 | A1 | 6/2009 | Uchino et al. |
| 2009/0172628 | A1 | 7/2009 | Chyan |
| 2010/0037200 | A1 | 2/2010 | Ghan |
| 2010/0106274 | A1 * | 4/2010 | Konno et al. ................... 700/97 |
| 2010/0115479 | A1 | 5/2010 | Hatano et al. |
| 2010/0122228 | A1 | 5/2010 | McCracken et al. |
| 2010/0199253 | A1 | 8/2010 | Cheng et al. |
| 2011/0014786 | A1 | 1/2011 | Sezginer |
| 2011/0119648 | A1 | 5/2011 | Chen et al. |
| 2011/0185329 | A1 | 7/2011 | Wen et al. |
| 2011/0219341 | A1 | 9/2011 | Cao et al. |
| 2011/0260318 | A1 * | 10/2011 | Eisenstadt ...................... 257/737 |
| 2011/0296360 | A1 | 12/2011 | Wang et al. |
| 2012/0079442 | A1 | 3/2012 | Akar et al. |
| 2012/0131528 | A1 | 5/2012 | Chen et al. |
| 2013/0019220 | A1 | 1/2013 | Maruyama et al. |
| 2013/0036396 | A1 | 2/2013 | Arayama et al. |
| 2013/0086543 | A1 | 4/2013 | Agarwal et al. |
| 2013/0086545 | A1 | 4/2013 | Alpert et al. |
| 2013/0155555 | A1 * | 6/2013 | Blanc et al. ..................... 361/56 |
| 2013/0159965 | A1 | 6/2013 | Karatal et al. |

OTHER PUBLICATIONS

Notice of Allowance dated Mar. 21, 2014 for U.S. Appl. No. 13/602,069.

Non-Final Office Action dated Sep. 20, 2013 for U.S. Appl. No. 13/602,069.

Hwang, Chanseok, and Massoud Pedram. "Interconnect design methods for memory design." Proceedings of the 2004 Asia and South Pacific Design Automation Conference. IEEE Press, 2004.

Lin, I-Jye, Tsui-Yee Ling, and Yao-Wen Chang. "Statistical circuit optimization considering device and interconnect process variations." Proceedings of the 2007 international workshop on System level interconnect prediction. ACM, 2007.

Ou, Hung-Chih, Hsing-Chih Chang Chien, and Yao-Wen Chang. "Simultaneous analog placement and routing with current flow and current density considerations." Proceedings of the 50th Annual Design Automation Conference. ACM, 2013.

Pompl, T., et al. "Practical aspects of reliability analysis for IC designs." Proceedings of the 43rd annual Design Automation Conference. ACM, 2006.

Singh, Jaskirat, and Sachin S. Sapatnekar. "Topology optimization of structured power/ground networks." Proceedings of the 2004 international symposium on Physical design. ACM, 2004.

Ex-parte Quayle Office Action dated May 23, 2014 for U.S. Appl. No. 13/602,069.

Notice of Allowance dated Jul. 14, 2014 for U.S. Appl. No. 13/602,071.

"Li et al., ""NEMO: A New Implicit-Connection Graph-Based Gridless Router With Multilayer Planes and Pseudo Tile Propagation,"" IEEE Trans. on CAD of ICs & Systems, vol. 26, No. 4 Apr. 2007, pp. 705-718.".

"Lin et al., ""Double Patterning Lithography Aware Grid less Detailed Routing with Innovative Conflict Graph,"" DAC'1 0, Jun. 13-18, 2010, pp. 398-403."

Cho et al., "Double Patterning Technology Friendly Detailed Routing", IEEE/ACM International Conference, 2008, pp. 506-511.

Dion et al., Contour: A Tile-based Gridless Router, 30 pages, Western Research Laboratory, Mar. 1995.

Non-Final Office Action dated Dec. 6, 2013 for U.S. Appl. No. 13/931,689.

Notice of Allowance dated Jun. 4, 2014 for U.S. Appl. No. 13/931,689.

Non-Final Office Action dated Jun. 13, 2014 for U.S. Appl. No. 13/931,627.

Non-Final Office Action dated Apr. 2, 2014 for U.S. Appl. No. 13/931,503.

Final Office Action dated May 1, 2014 for U.S. Appl. No. 13/931,707.

Non-Final Office Action dated Oct. 28, 2013 for U.S. Appl. No. 13/931,707.

Hsu et al., "Template-Mask Design Methodology for Double Patterning Technology," 2010 IEEE, pp. 107-111.

Jeffrey Salowe, "Gridding for Advanced Process Nodes" 2012.

Ou et al., "Simultaneous Analog Placement and Routing with Current Flow and Current Density Considerations", 2013.

U.S. Appl. No. 13/602,069, filed Aug. 31, 2012.

U.S. Appl. No. 13/602,071, filed Aug. 31, 2012.

U.S. Appl. No. 13/692,970, filed Dec. 3, 2012.

U.S. Appl. No. 13/705,164 filed Dec. 4, 2012.

Wang et al., "System on Chip Test Architecture", 2007.

Final Office Action dated Nov. 13, 2014 for U.S. Appl. No. 14/044,836.

Non-Final Office Action dated Jul. 15, 2014 for U.S. Appl. No. 14/044,836.

\* cited by examiner

ND ARTICLES OF
METHODS, SYSTEMS, AND ARTICLES OF MANUFACTURE FOR IMPLEMENTING HIGH CURRENT CARRYING INTERCONNECTS IN ELECTRONIC DESIGNS

CROSS-REFERENCE TO RELATED APPLICATION(S)

This Application is related to U.S. patent application Ser. No. 13/602,071 filed on Aug. 31, 2012 and entitled "METHODS, SYSTEMS, AND ARTICLES OF MANUFACTURE FOR ROUTING AN ELECTRONIC DESIGN USING SPACETILES" and U.S. patent application Ser. No. 13/602,069 filed on Aug. 31, 2012 and entitled "METHODS, SYSTEMS, AND ARTICLES OF MANUFACTURE FOR ROUTING AN ELECTRONIC DESIGN USING SPACETILES", the content of both U.S. patent applications is hereby incorporated by reference in its entirety for all purposes.

BACKGROUND

Integrated circuits, or ICs, are created by patterning a substrate and materials deposited on the substrate. The substrate is typically a semiconductor wafer. The patterned features make up devices and interconnections. This process generally starts with a designer creating an integrated circuit by hierarchically defining functional components of the circuit using a hardware description language. From this high-level functional description, a physical circuit implementation dataset is created, which is usually in the form of a netlist. This netlist identifies logic cell instances from a cell library, and describes cell-to-cell connectivity.

Many phases of these electronic design activities may be performed with computer aided design (CAD) tools or electronic design automation (EDA) systems. For example, an integrated circuit designer may use a set of layout EDA application programs, such as a layout editor, to create a physical integrated circuit design layout from a logical circuit design. The layout EDA application uses geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools. Verification may include, for example, design rule checking to verify compliance with rules established for various IC parameters. The EDA layout editing tools are often performed interactively so that the designer can review and provide careful control over the details of the electronic design.

Typically, geometric information about the placement of the nodes and components onto the chip is determined by a placement process and a routing process. The placement process is a process for placing electronic components or circuit blocks on the chip and the routing process is the process for creating interconnections between the blocks and components according to the specified netlist. The task of all routers is the same—routers are given some pre-existing polygons consisting of pins on cells and optionally some pre-routes from the placers to create geometries so that all pins assigned to different nets are connected by wires and vias, that all wires and vias assigned to different nets do not overlap, and that all design rules are obeyed. That is, a router fails when two pins on the same net that should be connected are open, when two pins on two different nets that should remain open are shorted, or when some design rules are violated during routing.

A layout file is created from the placement and routing process, which assigns logic cells to physical locations in the device layout and routes their interconnections. The physical layout is typically described as many patterned layers, and the pattern of each layer is described by the union of a set of polygons. The layout data set is stored, for example in GDSII ("Graphic Data System II") or OASIS ("Open Artwork System Interchange Standard") formats. Component devices and interconnections of the integrated circuit are constructed layer by layer. A layer is deposited on the wafer and then it is patterned using a photolithography process and an etch process.

In modern integrated circuits, some nets or interconnects may be required to carry high current(s) between wide pins, clusters of pins, or a combination of a wide pine and a cluster of pins. As a result, some design may require a wider minimum width for a high-current carrying interconnect so as to keep the current density under control. Conventional approaches are to route a "fat wire" between two pins. Nonetheless, the conventional approach may fail when some blockages or obstacles exist in the path of the "fat wire". In other words, such conventional approaches may not be able to find viable routing solutions, especially in congested regions of a layout. In addition, these approaches do not involve any search-based routing strategies or any area-based search strategies in implementing the interconnects between the two pins, pads, or terminals (hereinafter pin or pins.)

Thus, there exists a need for a method, a system, and an article of manufacture for implementing high current carrying interconnects. There also exist a need for a method, a system, and an article of manufacture for implementing high current carrying interconnects using strand routing of various topologies while satisfying various physical or electrical constraints, rules, or requirements and generating an electronic design that produces satisfactory results for various electrical analyses.

SUMMARY

Disclosed are method(s), system(s), and article(s) of manufacture for implementing high current carrying interconnects in one or more embodiments. Various embodiments implement the high current carrying interconnects by using at least a search based pattern route strategy. Some embodiments identify or determine a free or available area by sweeping a region of interest in which the high current carrying interconnects are to be implemented and identify or determine a routing topology based at least in part upon some characteristics of the source pin(s) and the destination(s).

Some embodiments further identify one or more strand numbers for the pins and implement parallel, multiple strands of interconnects between the source pin(s) and the destination pin(s). A routing topology may include an L-routing topology, a Z-routing topology, or a straight-routing topology. Some embodiments further analyses the region of interest that may include circuit features or blockages to identify or determine one or more valid intervals for the region of interest and then use the one or more valid intervals to guide a routing engine to implement the high current carrying interconnects between source pin(s) and destination pin(s). Some embodiments use spacetiles created by a spacetile punch process to determine the one or more valid intervals for guiding the routing engine to implement the high current carrying interconnects between pins.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 17 illustrates another post addition or modification design of the portion of the electronic circuit design that accommodates the aggressor while preserving the relative order of multiple interconnects in some embodiments.

DETAILED DESCRIPTION

Figure 1:
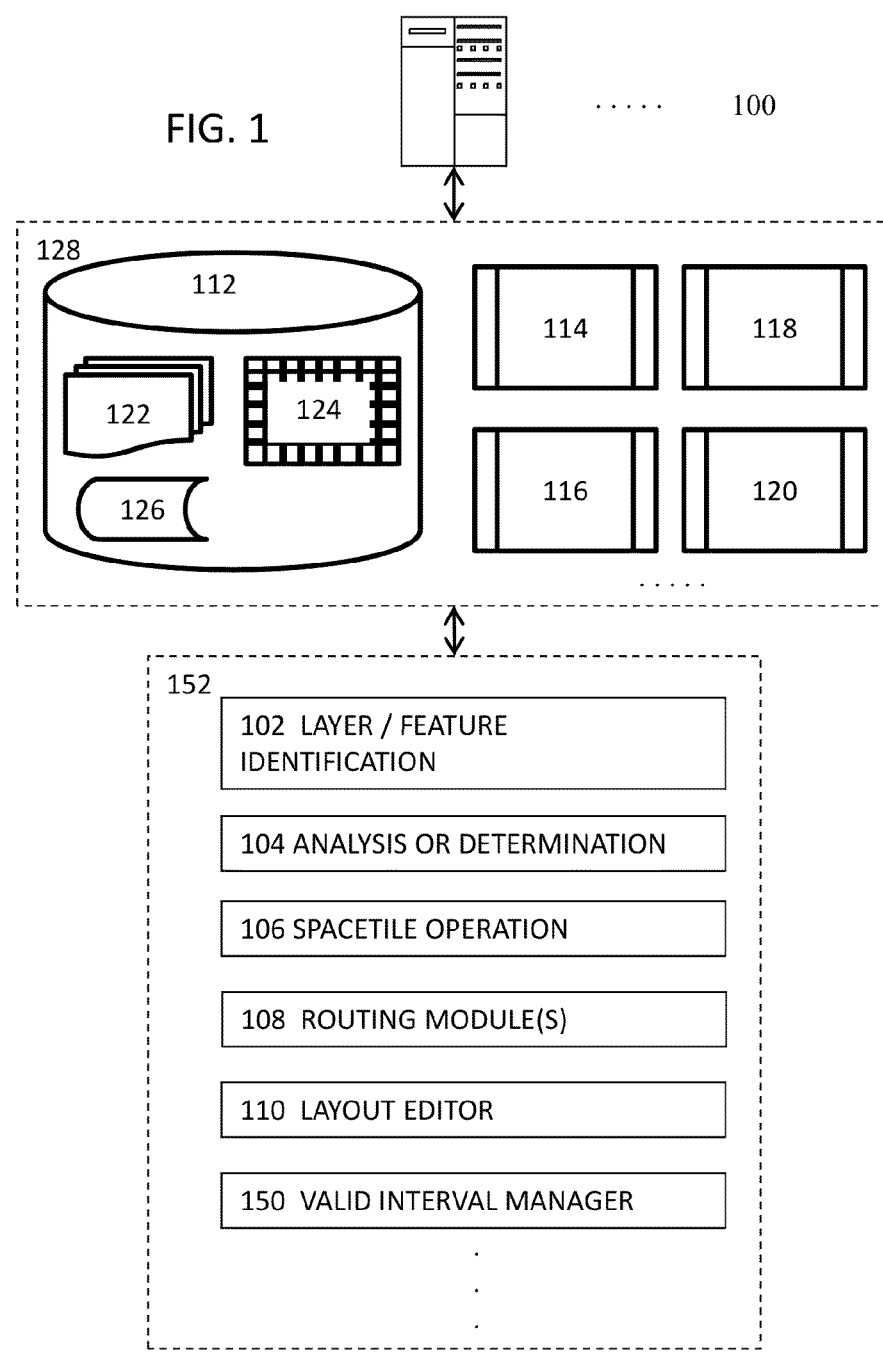
FIG. 1 illustrates a high level block diagram for a system for implementing high current carrying interconnects in some embodiments.

Various embodiments of the invention are directed to a methods, systems, and articles of manufacture for implementing high current carrying interconnects. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Disclosed are method(s), system(s), and article(s) of manufacture for implementing high current carrying interconnects in one or more embodiments. Various embodiments identify or determine a region of interest for routing high current carrying interconnects between one or more source pins and one or more destination pins. Some embodiments further process the region of interest to identify or determine a first set of one or more valid intervals by sweeping across the region of interest in a first direction using one or more spacetiles. Some other embodiments may further process the region of interest to identify or determine a second set of one or more valid intervals by sweeping across the region of interest in a second direction.

Some embodiments sweep across the region of interest by using spacetiles created by a spacetile punch process. These embodiments may also identify a routing topology for implementing the high current carrying interconnects based at least in part upon, for example, a routing topology. Some embodiments may also identify or determine one or more strand numbers, each of which indicates the number of strands that is to be used in implementing the high current carrying interconnects. Various embodiments may then implement the high current carrying interconnects by using the one or more strand numbers and the routing strategy by performing a search-based pattern route within the region of interest. Various embodiments may consider one or more physical requirements, one or more electrical requirements, one or more manufacturing requirements, or one or more functionalities of the high current carrying interconnects in implementing the interconnections between source pin(s) and destination pin(s). Various details of any of the processes, sub-processes, or acts are further provided below with reference to respective drawing figures.

FIG. 1 illustrates a high level block diagram for a method or a system for generating multi-layer local maximally spanning routing paths in a fractured space in some embodiments. In one or more embodiments, the system for generating multi-layer local maximally spanning routing paths in a fractured space may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access various resources 128 that may comprise a global routing engine and/or a detail routing engine 114, a layout editor 116, a design rule checker 118, a verification engine 120, etc. The one or more computing systems 100 may further write to and read from a local or remote volatile or non-volatile computer accessible storage 112 that stores thereupon data or information such as, but not limited to, one or more databases (124) such as schematic design database(s) or physical design database(s), libraries, data, rule decks, constraints, etc. (122), or other information or data (126) that may be used to facilitate the performance of various functions to achieve the intended purposes.

In some embodiments, the one or more computing systems 100 may, either directly or indirectly through various resources 128 to invoke various software, hardware modules or combinations thereof 152 that may comprises a routing layer or layout feature identification module 102 to identify one or more features or one or more layers, an analysis or determination module 104 to make various determinations, a spacetile operation module 106 to process any tasks involving spacetiles or spacetile layers either alone or jointly with one or more other modules, one or more routing modules 108 such as a global router or a detail router, a layout or physical design editor 110, a valid interval management module 150, etc.

In some embodiments, the one or more features of the first routing layer comprises a soft or hard track, a blockage, a via, an existing circuit component, a spacetile, or an area probe, or a combination thereof associated with the first routing layer. In some embodiments, the layer or feature identification module identifies one or more layers, such as metal 1 and metal 2, as well as a via layer therebetween, that are relevant to implementation of one or more interconnects from an electronic design. The identification of such one or more layers that are relevant to implementation of one or more interconnects will be described in greater details in subsequent paragraphs.

Figure 2:
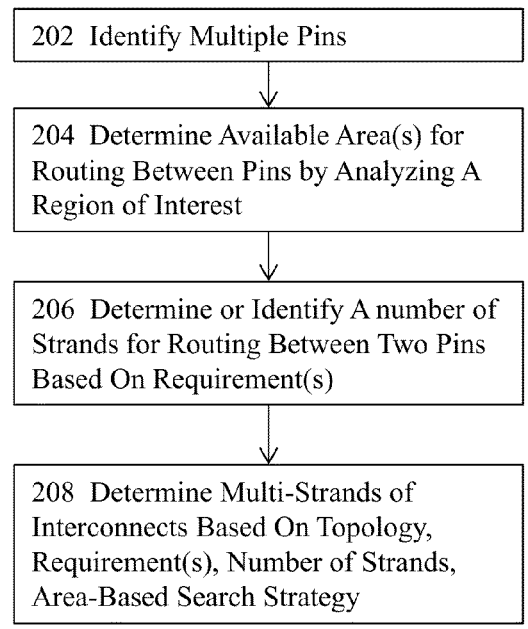
FIG. 2 illustrates a top level flow diagram for implementing high current carrying interconnects in some embodiments.

FIG. 2 illustrates a top level flow diagram for implementing high current carrying interconnects in some embodiments. In one or more embodiments, the method for implementing high current carrying interconnects comprises the process 202 of identifying multiple pins for which the implementation of interconnects among these multiple pins is desired. In these embodiments, the method may further comprise the process 204 for identifying a region of interest to determine one or more available areas for implementing interconnects between the multiple pins identified at 202. A region of interest will be described in greater details in subsequent paragraphs. In some embodiments, the method may further comprise the process 206 of determining or identifying a number of strands for implementing interconnects between two pins. It shall be noted that a pin may refer to a single pad, terminal, or pin or a cluster of multiple pins, pads, terminals, or a combination thereof and will be collectively referred to as a "pin" unless otherwise specifically recited in the application.

In some embodiments, the number of strands for routing between two pins may be specified or provided by, for example, the designer, the foundry, or may be determined based on the various requirements such as the requirement for maximum current density, electro-migration (EM) limit, timing analyses, noise analyses, etc. More details about determining available space for implementing interconnects will be described in subsequent paragraphs with reference to FIGS. 6-7. At 208, the method may further comprise the process 208 of determining a strand of interconnects between two pins based at least in part upon the routing topology of the strand of interconnects, one or more design constraints, design rules, or design requirements (hereinafter requirement or requirements, collectively), the number of strands, or one or more search strategies such as an area-based search strategy. More details about the determining a strand of interconnects will be provided in subsequent paragraphs with reference to FIG. 8.

Figure 3:
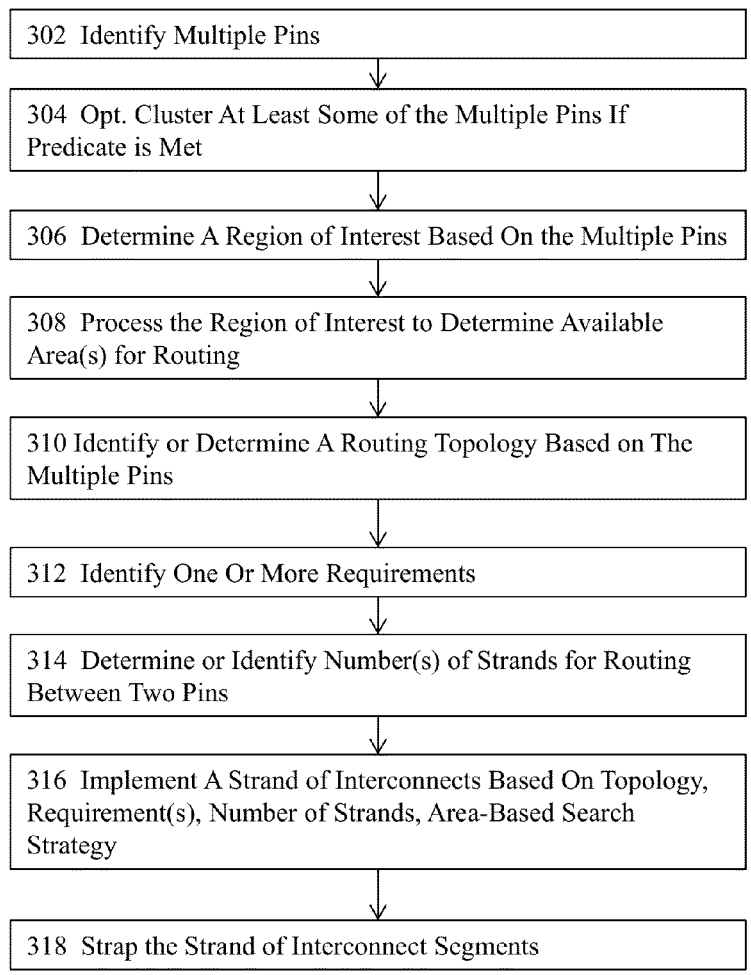
FIG. 3 illustrates a more detailed flow diagram for implementing high current carrying interconnects in some embodiments.

FIG. 3 illustrates a more detailed flow diagram for implementing high current carrying interconnects in some embodiments. In one or more embodiments, the method for implementing high current carrying interconnects may comprise the process 302 for identifying multiple pins in an electronic design. In some embodiments, the process 302 may identify one or more characteristics of the multiple pins. The one or more characteristics may include the absolute positions of each of the multiple pins, the relative positions between a source pin and a destination pin of the multiple pins, the relative orientation between a source pin and a destination pin of the multiple pins, the geometric shapes or coordinates of at least some of the multiple pins, the sizes of at least some of the multiple pins, distance(s) between a pin and its neighboring pin(s) (certain pins have only one neighboring pin on only one side, and some other pins may have neighboring pins on both sides), or a combination thereof, etc. in some embodiments.

In some embodiments, the method may optionally comprise the process 304 of clustering at least some of the multiple pins to form a single pin based at least in part upon a predicate. In some embodiments, the predicate may include, for example but not limited to, a threshold distance between two adjacent pins in some embodiments. In these embodiments, the method may cluster two pins and form a single, wide or wider pin if the distance between these two pins is smaller than or equal to the threshold distance. In some embodiments, the method may cluster two pins and form a single, wider pin by using a bounding box whose boundaries coincide with at least some of the boundaries of these two pins. In some embodiments, the method may cluster two pins and form a single, wider pin by creating the single, wider pin with the same area as the sum of the areas of the two individual pins and place the single, wider pin at an appropriate location.

In some embodiments, the method may optionally comprise the process 306 of determining a region of interest based at least in part on the multiple pins identified at 302. In some embodiments where one or more characteristics of at least some of the multiple pins are also identified, the method may further determine the region of interest based at least in part on the one or more characteristics. In some embodiments, the region of interest comprises a region in the electronic design that encompasses at least the source pin(s), the destination pin(s), and at least some available space.

In various embodiments, the region of interest may or may not comprise one or more blockages in the vicinity of the source pin(s) and the destination pin(s), regardless of whether or not the blockage(s) exist in the same vicinity of the source pin(s) and the destination pin(s). That is, existing blockages may or may not be "carved out" from the vicinity of the source pin(s) and the destination pin(s) to form the region of interest. In some embodiments, the region of interest is a dynamic region that changes during the implementation of at least some of multiple interconnects between the source pin(s) and the destination pin(s). In some embodiments, the region of interest is a static region that remains unchanged and encompasses the needed space for the implementation of all the interconnects between the source pin(s) and the destination pin(s).

In some embodiments, the method may optionally comprise the process 308 of determining one or more available areas within the region of interest for implementing one or more interconnects between a source pin and a destination pin. In some embodiment s, the method determines the one or more available areas by processing the region of interest. More details about determining one or more available areas for implementing one or more interconnects will be described in subsequent paragraphs with reference to FIGS. 6-7. In some embodiments, the method may optionally comprise the process 310 of identifying or determining a routing topology for implementing one or more interconnects between a source pin and a destination pin of the multiple pins.

In some embodiments where multiple strands of interconnects are to be used to interconnect the source pin and the destination pin, each of these multiple strands is to have a similar routing topology. A first routing topology is said to be similar to a second routing topology if the two routing topologies have the same number of bends in some embodiments. In some embodiments, the first routing topology is said to be similar to a second routing topology if the configuration of interconnects in the first routing topology is the same as that in the second routing topology. For example, if the first routing topology emanates from the source pin with a horizontal wire segment followed by a vertical wire segment and then a second horizontal segment that is connected to the destination pin, the second routing topology is said to be similar to the first routing topology if the second routing topology also emanates from a source pin with a horizontal wire segment followed by a vertical wire segment and then a second horizontal segment that is connected to its destination pin. It shall be noted that two similar routing topologies may or may not require that each wire segment in is of certain length or two adjacent interconnects are of a fixed spacing.

In some embodiments, the routing topology may comprise an L-routing topology where an L-route make one bend, which is not necessarily a 90-degree bend, to appear like the letter L, a Z-routing topology where an Z-route make two bends, each of which is not necessarily a 90-degree bend, to appear like a letter Z, and a straight-routing topology where a straight interconnect is used to connect a source pin and a destination pin. In some embodiments, the method may identify or determine the routing topology based at least in part upon the source pin and the destination pin. For example, the method may identify or determine the routing topology based at least in part upon the positions of the source and destination pins, the relative position of the source and destination pins, the relative orientation of the source and destination pins, etc. In some embodiments, the method may further identify or determine the routing topology based at least in part upon a requirement or preference to reduce the length of certain interconnects.

Figure 9A:
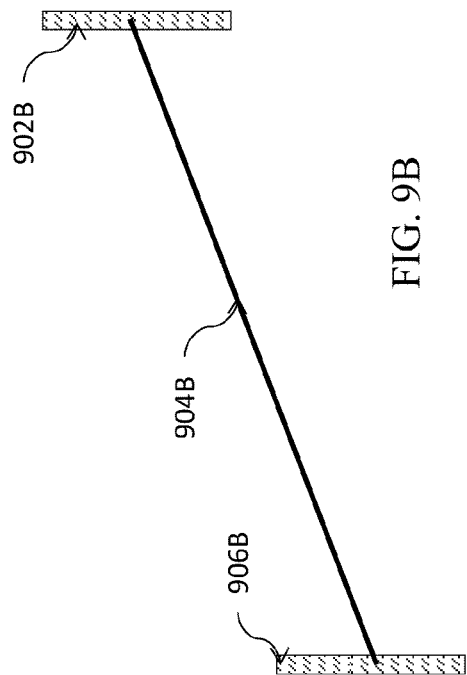
FIGS. 9A-D illustrate some typical cases of routing strands of interconnects between two pins in some embodiments.
Figure 9B:
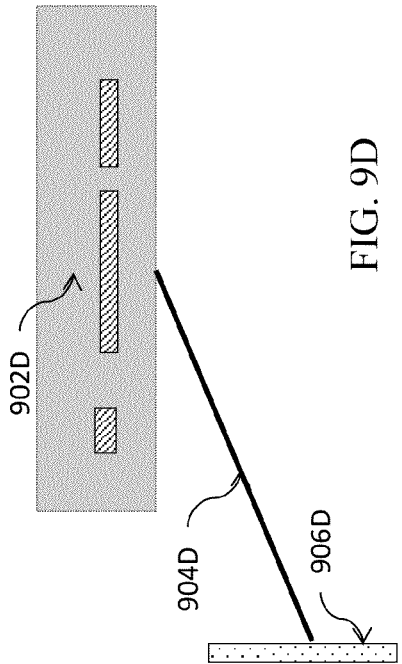
Figure 9C:
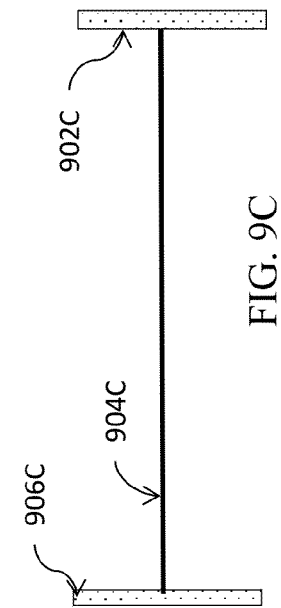

As another example, the method may analyze the source and destination pins 906C and 902C in FIG. 9C and determine that a straight route is viable and thus identifies the straight-routing topology as the routing topology. The method may analyze the source and destination pins 902A and 906A in FIG. 9A and determine that both an L-route and a Z-route are viable and thus identifies the L-routing topology or the Z-routing topology as the routing topology. The method may analyze the source and destination pins 902B and 906B in FIG. 9B and determine that both an L-route and a Z-route are viable and thus identifies the L-routing topology or the Z-routing topology as the routing topology. The method may analyze the source and destination pins 902D and 906D in FIG. 9D and determine that an L-route is viable and thus identifies the L-routing topology.

In some embodiments, the method may optionally comprise the process 312 of identifying one or more requirements for implementing the electronic design. The one or more requirements may comprise, for example but not limited to, a requirement of current density or densities at various frequencies for various interconnects, a requirement of electro-migration limit(s), constant spacing requirement(s) or spacing requirement(s) based on parallel run-length(s), requirement (s) of width(s) of various interconnects, the functionality of certain wires or interconnects (e.g., for differential pairs, screens, etc.), electrical constraints, or physical constraints, etc. In some embodiments, the method may optionally comprise the process 314 of identifying or determining one or more numbers of strands for routing interconnects between the source pin and the destination pin. The number of strands of interconnects connected to the source may or may not be the same as the number of strands of interconnects connected to the destination pins. In addition, the number of strands of the intermediate or bridging interconnect segments in a Z-routing topology may or may not be the same as either number of strands of interconnects connected to the source pin and the destination pin.

In some embodiments, the number of strands of interconnect segments may be specified or prescribed by, the designer, the foundry, the specification of the electronic design, etc. In some embodiments, the number of strands of interconnect segments may be determined by the maximum allowable number of interconnect segments based at least in part on, for example, the length of the pin, the width of each interconnect segment connected to the pin, etc. In some embodiments, the strand number may be determined based at least in part upon a redundancy requirement. For example, if the minimum strand number for a given wire width and a given current density is three, the method may determine the strand number to be any number greater than three such that the strand of interconnects include one or more redundant interconnects to cope with, for example, failures.

In some embodiments where the strand number indicates the number of strands for the bridging interconnect segments, the strand number may be determined based on the strand number for the source pin, the strand number for the destination pin, or both. For example, the strand number for the bridging interconnect segments may be the larger or the smaller of the strand numbers for the source pin and the destination pin. In some embodiments, the method may optionally comprise the process 316 of implementing a strand of interconnects for the multiple pins in the electronic design. In some embodiments, the process 316 implements the strand of interconnects based at least in part upon a criterion that comprises, for example but not limited to, the routing topology, one or more requirements, or one or more number of strands.

In some embodiments, the process 316 implements the strand of interconnects by using a search-based routing strategy including, for example but not limited to, an area-based search strategy or a degenerated area-based search strategy by using one or more areas, one or more spacetiles, one or more area probes associated with one or more areas or one or more spacetiles, or a combination thereof. A spacetile comprises an n-dimensional geometric entity in the routing space in some embodiments. The method may then identify a spacetile as an area probe to guide a router (e.g., a point-to-point router that routes an interconnect between two points in the design) to perform area search for routing an electronic design. An area probe may be used to store information such as the information about the spacetile itself, various information about routing the interconnect (e.g., destination location, beginning location, etc.) in some embodiments.

In some embodiments, the method may further mark or label the spacetiles. In various embodiments, a spacetile may be used as an area probe by the method or system to search for viable routing solutions. Regardless of the dimensionality of a spacetile, a space tile may be considered as an area probe, whereas the zero- and one-dimensional spacetiles are considered degenerated area probes. In some embodiments, the method may optionally comprise the process 318 of strapping the strand of interconnect segments at the intersections. In some embodiments where the electronic design being processed includes multiple layers each having its own preferred routing direction, the process 318 may strap the strand of interconnect segments at their intersection(s) by using one or more vias at their intersection(s).

Figure 4:
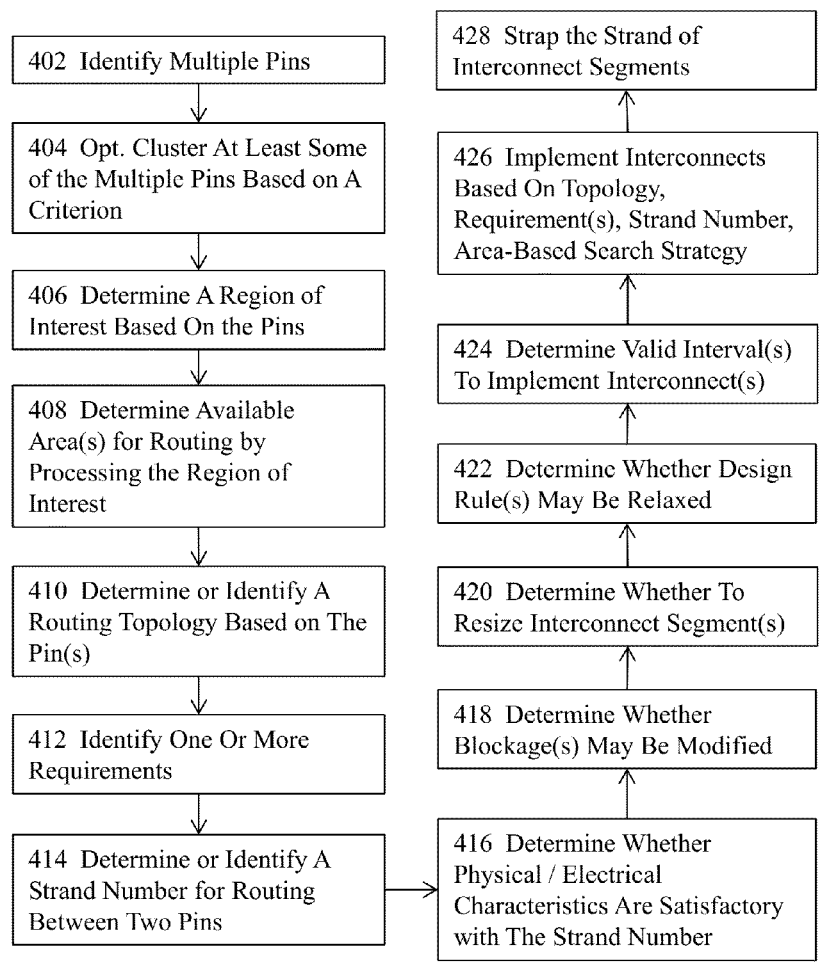
FIG. 4 illustrates a more detailed flow diagram for implementing high current carrying interconnects in some embodiments.

FIG. 4 illustrates a more detailed flow diagram for implementing high current carrying interconnects in some embodiments. In one or more embodiments, the method for implementing high current carrying interconnects may comprise the process 402 for identifying multiple pins in an electronic circuit design. In some embodiments, the process 402 comprises the acts that are substantially similar to those described with reference to 302 in FIG. 3. In some embodiments, the method may optionally comprise the process 404 of clustering at least some of the multiple pins into one single pin based at least in part upon a criterion. More details about clustering at least some of multiple pins into one single pin will be described in subsequent paragraphs with reference to FIG. 5.

In some embodiments, the method may optionally comprise the process 406 of determining a region of interest based at least on the multiple pins. The process 406 may comprise various acts that are substantially similar to those described in 306 of FIG. 3 in some embodiments. In some embodiments, the method may optionally comprise the process 408 of determining one or more available areas by processing the region of interest determined or identified at 406. More details about determining one or more available areas will be described in subsequent paragraphs with reference to FIGS. 6-7.

At 410, the method may further identify or determine a routing topology based at least in part upon the multiple pins or one or more characteristics associated with at least some of the multiple pins in some embodiments. The process 410 may include substantially similar acts as those described for 310 of FIG. 3 in some embodiments. In some embodiments, the method may optionally comprise the process 412 of identifying one or more requirements for the electronic circuit design under consideration. The one or more requirements may comprise, for example but not limited to, a requirement of current density or densities at various frequencies for various interconnects, a requirement of electro-migration limit(s), constant spacing requirement(s) or spacing requirement(s) based on parallel run-length(s), requirement(s) of width(s) of various interconnects, the functionality of certain wires or interconnects (e.g., for differential pairs, screens, etc.), electrical constraints, or physical constraints, etc. The one or more requirements may include a hard requirement that must be satisfied, a soft requirement that may be relaxed or ignored, or a combination.

In some embodiments, the method may optionally comprise the process 414 of identifying or determining one or more strand numbers for routing interconnects between two of the multiple pins identified at 402. In various embodiments, a strand number is used to determine the number of interconnect segments that are to be created for routing between two pins. For routing between two pins in an electronic circuit design, there may be one, two, or even more than two different strand numbers, depending upon the routing topology for the interconnects connecting the source pin and the destination pin. In some embodiments, the method may optionally comprise the process 416 of determining whether one or more physical characteristics, one or more electrical characteristics, or a combination thereof with the one or more strand numbers determined at 414.

For example, the process 416 may check whether the number of interconnects as prescribed by the strand number(s) as well as other requirement(s) (e.g., minimum width of an interconnect, etc.) meet the current density requirement(s) in some embodiments. As another example, the process 416 may check whether the number of interconnects as prescribed by the strand number(s) as well as other requirement(s) (e.g., minimum spacing requirement, etc.) meet the noise requirement. As another example, the process 416 may check whether the number of interconnects meet the timing requirement or noise requirement based on, for example, the routing topology and the locations of the pins in the electronic circuit design.

In some embodiments, the method may optionally comprise the process 418 of determining whether there exist some blockage shapes in the region of interest. In some of these embodiments, if the process 418 determines that there exist some blockage shapes in the region of interest, the process 418 may further optionally determine whether a blockage shape in the region of interest may negatively affect the likelihood of determining a viable routing solution between a source pin and a destination pin of the multiple pins with the strand number(s) identified at 414 or the routing topology identified or determined at 410. In some of these embodiments, the process 418 may determine whether a blockage shape may be modified. In some of these embodiments where the process 418 determines that the blockage shape may be modified, the process 418 may further include modifying (e.g., shrinking, etc.) the shape of the blockage shape.

In some of these embodiments, the process 418 may include re-positioning the blockage shape by, for example, rotating the blockage shape at the same location, translating the blockage shape to another location, or both. In some of these embodiments, the process 418 may modify the blockage shape based at least in part upon the routing topology. For example, if the routing topology is likely to require horizontal interconnect segments in the vicinity of a blockage shape, the process 418 may modify, if possible, the blockage shape by re-orienting, translating, modifying the shape of the blockage, or a combination thereof such that the blockage shape no longer impedes the implementation of the interconnect segments between a source pin and a destination pin of the multiple pins.

In some embodiments, the method may optionally comprise the process 420 of determining whether at least one interconnect segment is to be re-sized to a wider or narrower width. In some of these embodiments, the process 420 makes the determination based at least in part upon the strand number(s) the at least one interconnect segment is associated with, one or more requirements (e.g., minimum spacing design rule, minimum width design rule, cross-coupling requirement(s), noise requirement(s), current density requirement(s) or EM limit(s), or a combination thereof, etc. That is, the method may adjust an interconnect segment (width, spacing, etc.), modify a blockage shape, or perform both to implement the interconnect segment in some embodiments. In some embodiments, the method may optionally comprise the process 422 of determine whether one or more requirements may be relaxed.

For example, if the processes determine that, after modifying the blockage shape and/or adjusting the interconnect segment(s), there still does not exist a viable routing solution to implement a strand of interconnects, the process 422 may determine whether some requirements, such as the spacing rule, may be relaxed based at least in part upon, for example but not limited to, one or more performance or manufacturability requirements. For example, the process 422 may determine whether the minimum spacing rule may be relaxed to allow a narrower spacing value between two neighboring interconnects or between an interconnect and a circuit feature (e.g., a blockage shape) such that the relaxed requirement will result in a viable routing solution for the strand of interconnects. A circuit feature may include, for example but not limited to, an interconnect segment, a circuit component, a block of circuit components, etc.

In some embodiments, the method may comprise the process 424 of determining one or more valid or live intervals (hereinafter valid interval or valid intervals) to implement interconnection between a source pin and a destination pin of the multiple pins. More details of determining one or more valid intervals will be described in subsequent paragraphs with reference to FIGS. 6-7. In some embodiments, the method may comprise the process 426 of implementing multiple-strand interconnects between a source pin and a destination pin of the multiple pins. More details of implementing multiple-strand interconnects between a source pin and a destination pin will be described in subsequent paragraphs with reference to FIG. 8.

In some embodiments, the method may optionally comprise the process 428 of strapping at least some of the implemented interconnects. In some embodiments where each of a plurality of layers has a preferred routing direction, the process 428 may strap at least some of the implemented interconnects by, for example, using one or more vias at the intersection(s) of two or more interconnects belonging to two adjacent routing layers.

Figure 5:
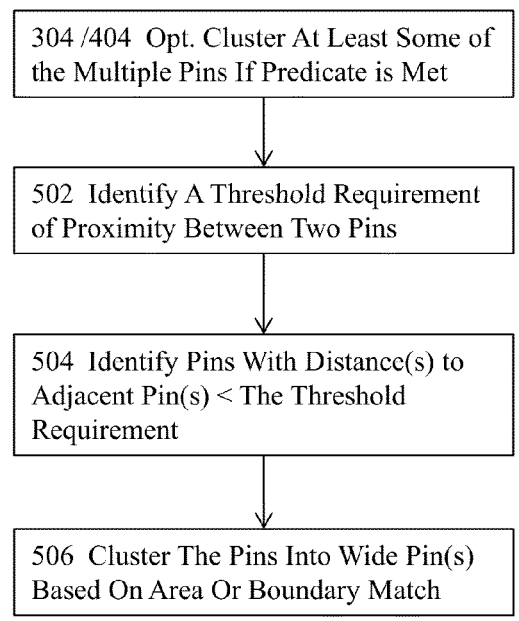
FIG. 5 illustrates a more detailed flow diagram for optionally clustering some pins in an electronic circuit design in some embodiments.

FIG. 5 illustrates a more detailed flow diagram for optionally clustering some pins in an electronic circuit design in some embodiments. In one or more embodiments, the process 304 or 404 of clustering at least some of the multiple pins comprise the process 502 of identifying a threshold requirement of proximity between two neighboring pins of the multiple pins to be interconnected. For example, the threshold requirement of proximity may require that two adjacent pins having a distance smaller than or equal to the threshold requirement of proximity be clustered into one wider pin.

In some embodiments, the process 304 or 404 of clustering at least some of the multiple pins comprise the process 504 of identifying pins that are within the threshold requirement of proximity to one or more neighboring pins. In one or more embodiments, the process 304 or 404 of clustering at least some of the multiple pins comprise the process 506 of clustering the pins identified at 504 into one or more wider pins. A wider pin may have an identical area as the sum of the areas of the individual, constituent pins in some embodiments. A wider pin may have a boundary that matches a bounding box encompassing the individual, constituent pins in some other embodiments.

Figure 6:
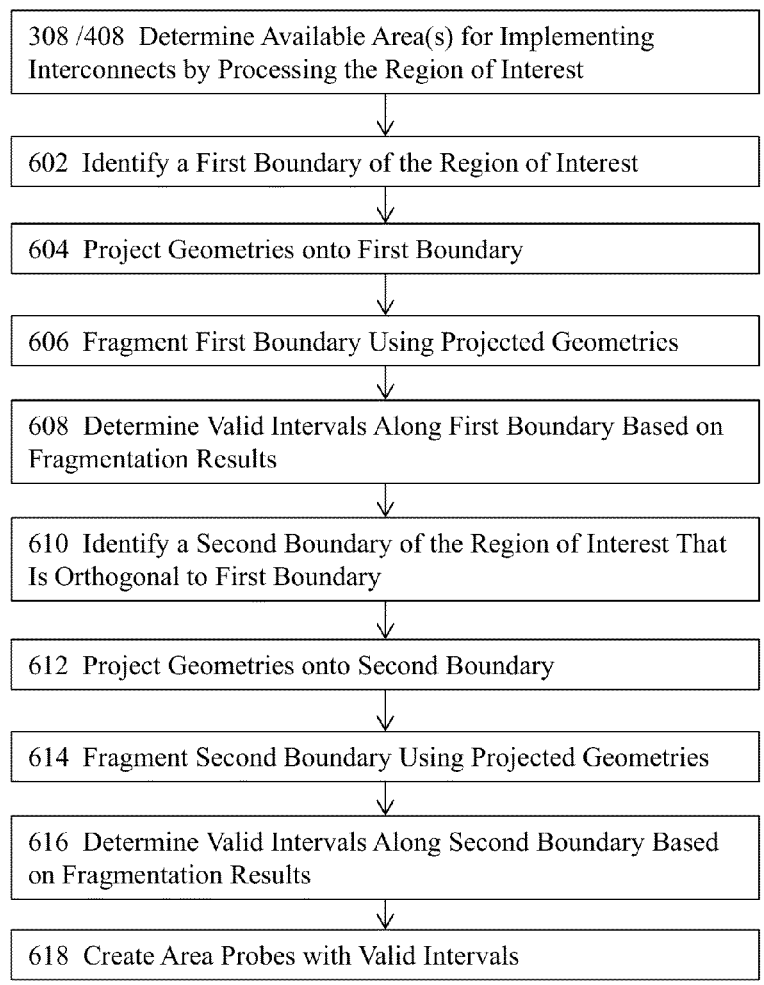
FIG. 6 illustrates a more detailed flow diagram for determining available areas for implementing interconnects in some embodiments.

FIG. 6 illustrates a more detailed flow diagram for determining available areas for implementing interconnects in some embodiments. In one or more embodiments, the process 304 or 408 of implementing interconnects by processing the region of interest may comprise the process 602 of identifying a first boundary of the region of interest. In some embodiments, the first boundary is parallel to a first routing direction of a first routing later. For example, the process 602 may identify the left boundary or the right boundary of the region of interest as the first boundary. In some embodiments, the process 304 or 408 may comprise the process 604 of projecting geometries in the region of interest onto the first boundary identified at 602 to create a first set of projected geometries along the first boundary. In these embodiments, the projected geometries along the first boundary include zero-dimensional points and one-dimensional line segments.

In some embodiments, the process 304 or 408 may comprise the process 606 of fragmenting the first boundary based at least in part upon the first set of projected geometries along the first boundary of the region of interest. In some embodiments, the process 304 or 408 may comprise the process 608 of determining a first set of one or more valid intervals along the first boundary based at least in part upon the fragmentation results. In these embodiments, a valid interval comprises a zero- (a degenerated interval) or one-dimensional interval along a boundary of the region of interest which is not covered by any projected geometries from the geometries in the region of interest. In other words, a valid interval comprises a point or a line segment along a boundary of the region of interest from which a routing engine may start searching for viable routing solutions.

In some embodiments, the process 304 or 408 may comprise the process 610 of identifying a second boundary of the region of interest. In some embodiments, the second boundary is in the second routing direction of a second routing layer that is immediately atop or below the first routing layer. In the example above where the process 602 identifies the left boundary of the region of interest as the first boundary which is parallel with a vertical routing direction of a first routing layer, the process may then identify either the top or the bottom boundary, which is parallel to a second routing of a horizontal second routing layer that is atop or below the vertical first routing layer, of the region of interest as the second boundary. It shall be noted that two orthogonal routing directions are used in this example. Nonetheless, various embodiments described herein are not limited to only orthogonal routing directions for implementing the interconnects on various routing layers.

In some embodiments, the process 304 or 408 may comprise the process 612 of projecting the geometries in the region of interest onto the second boundary to for a second set of projected geometries along the second boundary in a substantially similar manner as that described for process 604 above. In some embodiments, the process 304 or 408 may comprise the process 614 of fragmenting the second boundary based at least in part upon the second set of projected geometries along the second boundary. In some embodiments, the process 304 or 408 may comprise the process 616 of determining a second set of one or more valid intervals along the second boundary of the region of interest based at least upon the fragmentation results obtained from process 614.

In some embodiments, the process 304 or 408 may comprise the process 618 of creating or associating one or more probes (e.g., an area probe) with the first set of one or more valid intervals or with the second set of one or more valid intervals or with both the first set and the second set of one or more valid intervals. An area probe represents an n-dimensional geometric entity or object in the context of object-oriented programming in which or on which the center line(s) of interconnect(s) may lie and thus may be used by various embodiments of the method or system to perform area search in order to determine the route for an interconnect. An area probe may be used to store information such as the information about the zero-, one-, or two-dimensional area itself, various information about routing the interconnect (e.g., exact or approximate location, distance, or direction of the destination, exact or approximate location, direction, or distance of the beginning point of the route, or associated design rule(s), etc.) to guide search for routing the interconnect in some embodiments. In these embodiments, the process 618 may identify a valid interval (zero- or one-dimensional) along a boundary of the region of interest and identify the geometric entity (an area or a line segment) in the region of interest and create or associate an area probe with the geometric entity to guide a routing engine to search for a viable routing solution.

Figure 7:
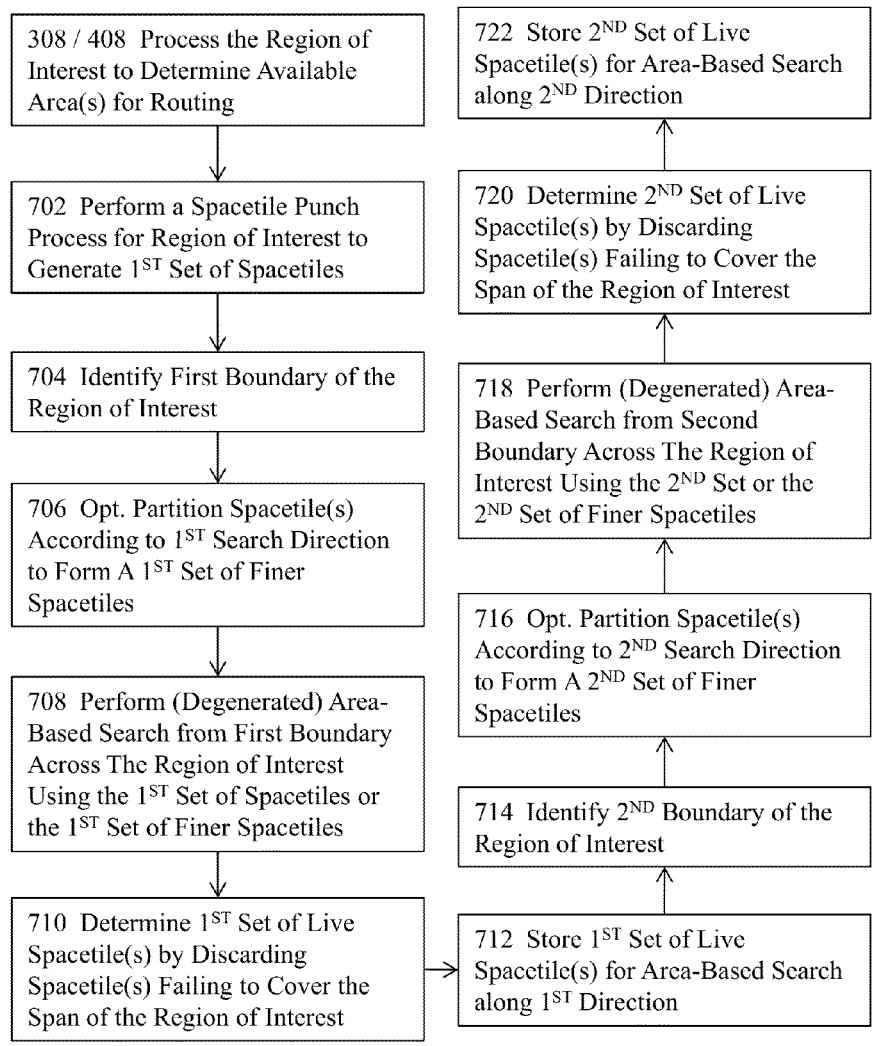
FIG. 7 illustrates another more detailed flow diagram for determining available areas for implementing interconnects in some embodiments.

FIG. 7 illustrates another more detailed flow diagram for determining available areas for implementing interconnects in some embodiments. In one or more embodiments, the process 308 or 408 for determining one or more available areas for implementing interconnects may comprise the process 702 of performing a spacetile punch process for the region of interest to generate a first set of spacetiles. It shall be noted that the recitation of "a spacetile punch" does not necessarily a single spacetile punch. Rather, the recitation of "a spacetile punch" refers to the performance of the spacetile punch process, which is explained in greater details below, and thus may include one or more "spacetile punches".

In some embodiments, the process 308 or 408 may comprise the process 704 of identifying a first boundary of the region of interest identified at 702 in a substantially similar manner as that described for 602 and 610 with reference to FIG. 6. In some embodiments, the process 308 or 408 may comprise the process 706 of optionally partitioning at least one spacetile into multiple smaller spacetiles. In these embodiments, the optional process 706 generates a first set of finer spacetiles. More details about the spacetile punch process and partitioning a spacetile are described in U.S. patent application Ser. No. 13/602,071 filed on Aug. 31, 2012 and entitled "METHODS, SYSTEMS, AND ARTICLES OF MANUFACTURE FOR ROUTING AN ELECTRONIC DESIGN USING SPACETILES" and U.S. patent application Ser. No. 13/602,069 filed on Aug. 31, 2012 and entitled "METHODS, SYSTEMS, AND ARTICLES OF MANUFACTURE FOR ROUTING AN ELECTRONIC DESIGN USING SPACETILES", the content of both U.S. patent applications is hereby incorporated by reference in its entirety for all purposes.

In some embodiments, the process 308 or 408 may comprise the process 708 of performing search starting from the first boundary across the region of interest by using the first set of spacetiles or the first set of finer spacetiles. That is, the process 708 may perform the search by using some of the spacetiles created at 702 or by using some partitioned, finer spacetiles created by the optional partitioning process 706. In some of these embodiments, the process 708 may use one or more area probes associated with the corresponding spacetiles to guide, for example, the routing engine, to perform area-based search for viable routing solutions. In some embodiments, the process 308 or 408 may optionally comprise the process 710 of determining a first set of live spacetiles by discarding one or more spacetiles that fail to cover the span of the region of interest.

Figure 10:
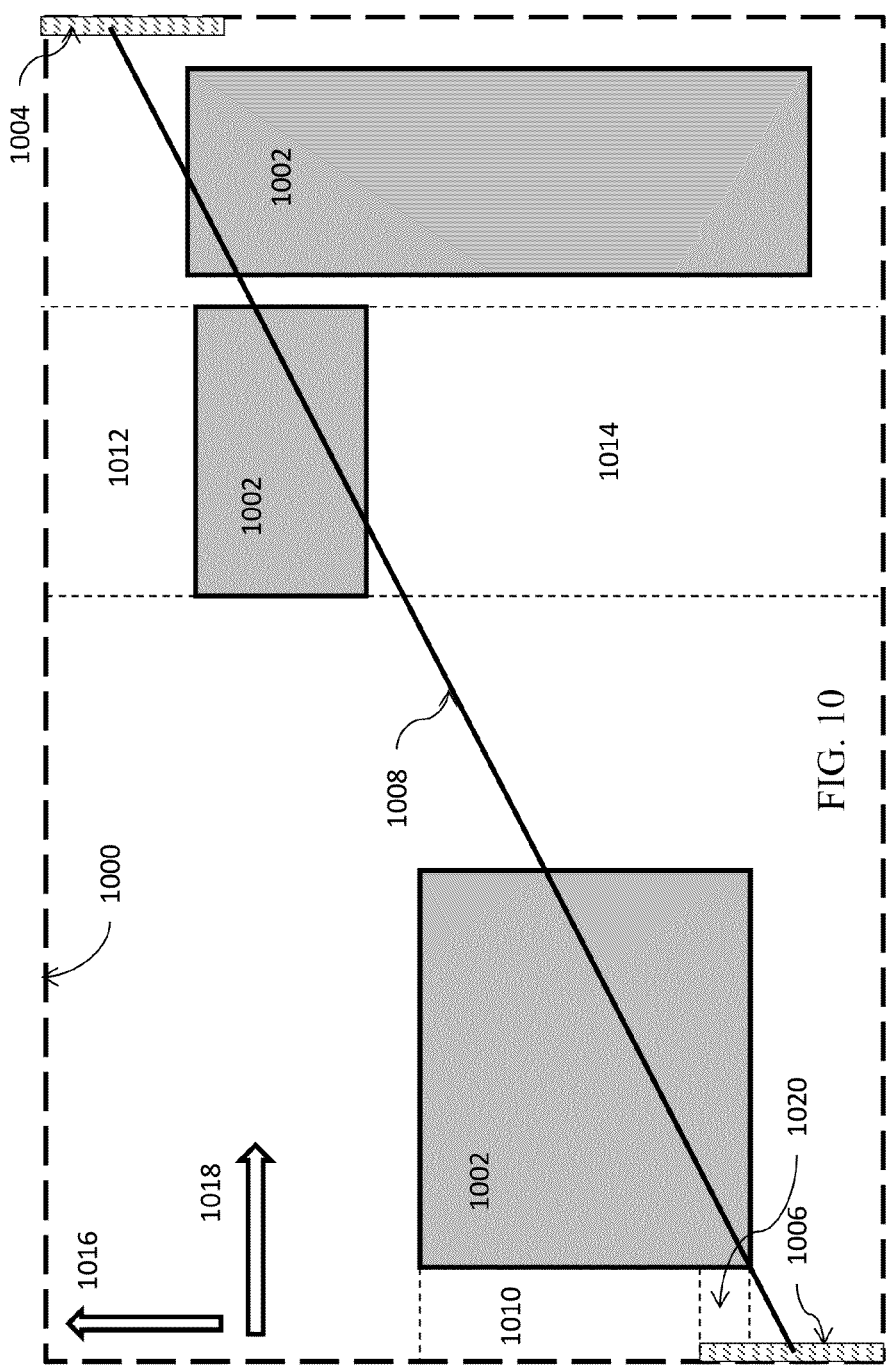
FIG. 10 illustrates an example for routing between two wide pins in an area including some blockages in some embodiments.

For example, FIG. 10 illustrates a simplified region of interest 1000 including three blockage shapes 1002. FIG. 10 also illustrates some exemplary spacetiles 1010, 1020, 1012, and 1014. The spacetiles 1012 and 1014 may be created by the spacetile punch process. The spacetiles 1010 and 1020 may be created by the spacetile punch process first and then by the partitioning process to form two finer spacetiles, rather than a larger spacetile that represents the union of 1010 and 1020. In this example shown in FIG. 10, spacetiles 1012 and 1014 fail to span across substantially the entire span of the region of interest in the first direction 1016 and thus may be discarded from the first set of live spacetiles for routing horizontal interconnects in some embodiments.

It shall be noted that a live spacetile in the set may need to span across substantially the entire length (or width) of the region of interest because, for example, the region of interest 1000 may or may not encompass the widths of the pins 1006 and 1004. In the example shown in FIG. 10, the region of interest 1000 does encompass the widths of pins 1004 and 1006. Nonetheless, the region of interest may also be identified not to include such widths. In some other embodiments, the spacetiles, although failing span across substantially the entire length (or width) of the region of interest, may nonetheless be considered as the live spacetiles because certain electronic designs (such as the one shown in FIG. 10) may not have straight interconnects between two pins. In the example shown in FIG. 10, the interconnects are more likely to assume a z-routing topology.

As a result, the horizontal interconnects connected to pins 1006 and those connected to pin 1004 are unlikely to span across substantially the entire length of the region of interest 1000. Similarly, spacetiles 1010 and 1020 also fail to span across substantially the entire region of interest 1000 in the second direction 1018 and thus may be discarded from the second set of live spacetiles for routing vertical interconnects in some embodiments. In some embodiments, the process 308 or 408 may comprise the process 712 of storing the first set of live spacetiles that may be used for area-based search along a first direction such as a first routing direction for a first routing layer. In some embodiments, the process 308 or 408 may comprise the process 714 of identifying a second boundary of the region of interest in a substantially similar manner as that described for process 610 with reference to FIG. 6.

In some embodiments, the process 308 or 408 may optionally comprise the process 716 of partitioning at least one spacetile into multiple smaller spacetiles and storing the multiple smaller spacetiles in a second set of finer spacetiles in a substantially similar manner as that described for process 706 above. In some embodiments, the process 308 or 408 may comprise the process 718 of performing a search starting from the second boundary across the region of interest using the second set of spacetiles or the second set of finer spacetiles. In some embodiments, the method may perform area-based search by creating or associating one or more area probes with one or more spacetiles created by the spacetile punch process at 702 or the set of finer spacetiles created by the partitioning process at 706 and 716. More details about the search-based routing strategy using spacetiles or area probes are described in U.S. patent application Ser. No. 13/602,071 filed on Aug. 31, 2012 and entitled "METHODS, SYSTEMS, AND ARTICLES OF MANUFACTURE FOR ROUTING AN ELECTRONIC DESIGN USING SPACETILES" and U.S. patent application Ser. No. 13/602,069 filed on Aug. 31, 2012 and entitled "METHODS, SYSTEMS, AND ARTICLES OF MANUFACTURE FOR ROUTING AN ELECTRONIC DESIGN USING SPACETILES", the content of both U.S. patent applications is hereby incorporated by reference in its entirety for all purposes.

In some embodiments, the process 308 or 408 may optionally comprise the process 720 of determining a second set of live spacetiles by discarding one or more spacetiles that fail to span across the region of interest in a second direction such as a second routing direction of a second routing layer. In some embodiments, the process 308 or 408 may optionally comprise the process 722 of storing the second set of live spacetiles for a search strategy along the second direction such as a second routing direction of a second routing layer.

Figure 8A:
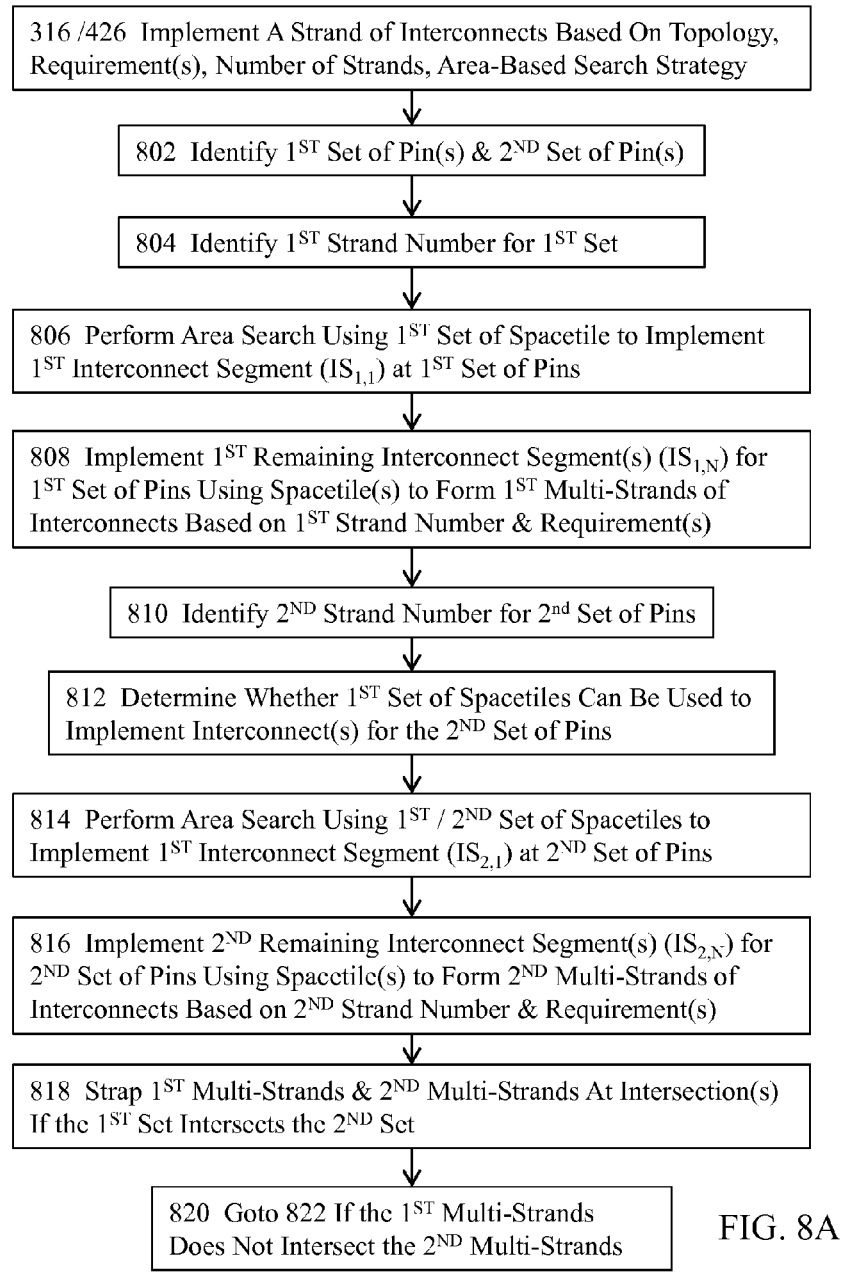
FIG. 8 includes partial views FIGS. 8A-B which jointly illustrate a more detailed flow diagram for determining a strand of interconnects in some embodiments.
Figure 8B:
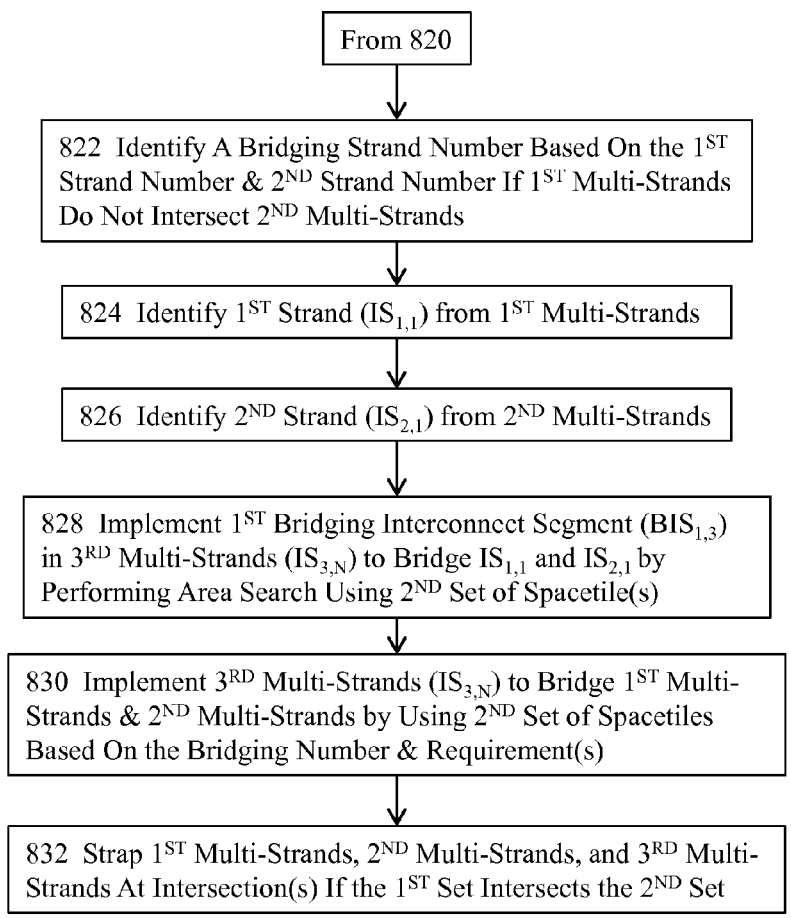

FIG. 8 includes partial views FIGS. 8A-B which jointly illustrate a more detailed flow diagram for implementing a strand of interconnects in some embodiments. In one or more embodiments, the process 316 or 426 of implementing a strand of interconnects may comprise the process 802 of identifying a first set of pins and a second set of pins. For example, the process 802 may identify the first set of pins as the source and the second set of one or more pins as the destination. In some embodiments, the process 316 or 426 may comprise the process 804 of identifying a first strand number for the first set of one or more pins. In some embodiments, the number of strands of interconnect segments may be specified or prescribed by, the designer, the foundry, the specification of the electronic design, etc.

In some embodiments, the number of strands of interconnect segments may be determined by the maximum allowable number of interconnect segments based at least in part on, for example, the length of the pin, the width of each interconnect segment connected to the pin, etc. In some embodiments, the strand number may be determined based at least in part upon a redundancy requirement. In some embodiments, the process 316 or 426 may comprise the process 806 of performing a search for a viable routing solution to implement a first interconnect segment in the first strand of interconnects for the first set of one or more pins by using a first set of spacetiles.

For example, the process 806 may perform an area-based search by using some of the first set of spacetile to determine where within the some of the first set of spacetiles the centerline of an interconnect may lie. In some embodiments, the process 806 may identify a spacetile from the first set of spacetiles as an area probe to guide a router (e.g., a point-to-point router that routes an interconnect between two points in the design) to perform area-based search for routing the interconnect. An area probe represents a n-dimensional geometric entity or an object within the context of object-oriented programming in which or on which the center line(s) of interconnect(s) may lie and thus may be used by various embodiments of the method or system to perform area search in order to determine the route for an interconnect.

An area probe may be used to store information such as the information about the spacetile itself, various information about routing the interconnect (e.g., destination location, beginning location, etc.) to guide the routing engine or other processes to implement the interconnect in some embodiments. An area probe may also be associated with a cost value or a cost function for the method to determine the cost of implementing an interconnect in a certain manner. In some embodiments, the process 316 or 426 may comprise the process 808 of implementing the remaining interconnect segment(s) ($IS_{1,N}$) to form a first multi-strands of interconnect segments for the first set of pins using the first set of spacetiles that are created by the spacetile punch process for the region of interest.

In some of these embodiments, the process 808 may implement the remaining interconnect segment(s) based at least on the strand number identified for the first set of pins. In some embodiments, the process 808 may implement the remaining interconnect segment(s) based at least in part upon one or more requirements that may include, for example but not limited to, spacing requirement(s), electrical requirement(s) (e.g., noise or parasitics), physical requirement(s), etc. In some embodiments, the process 316 or 426 may comprise the process 810 of identifying a second strand number for the second set of pins. In some embodiments, the second strand number may be determined by the maximum allowable number of interconnect segments based at least in part on, for example, the length of the pin, the width of each interconnect segment connected to the pin, etc.

In some embodiments, the second strand number may be determined based at least in part upon a redundancy requirement as described for process 314 with reference to FIG. 3. In some embodiments, the process 316 or 426 may comprise the process 812 of determining whether the first set of spacetiles can be used to implement the interconnect(s) for the second set of pins. Referring to FIGS. 9A-D as examples, FIG. 9B shows two pins 902B and 906B in the same orientation. If the routing engine chooses a Z-routing topology to implement the interconnects between these two pins, the horizontal interconnect segments connected to both pins may be implemented by using the same set of spacetiles in some embodiments. Of course, the method may always perform the spacetile punch process to determine a new set of spacetiles for each interconnect segment being implemented in some other embodiments.

FIG. 9C shows two pins 902C and 906C that not only are laid out in the same orientation but also are aligned horizontally. In this example shown in FIG. 9C, the routing engine is more likely to choose a straight-routing topology to implement the entire interconnect(s) with one set of spacetiles.

FIGS. 9A and D show two pins that are orthogonal to each other. In these two examples, the method may choose the L-routing topology to implement the interconnect(s) between two pins. In some embodiments, the method may still use the same set of spacetiles to implement the interconnects in both examples. In some other embodiments, the method may perform the spacetile punch process first for the vertical pin (e.g., 906A and 906D) and then a separate spacetile punch process for the horizontal pin (902A and 902D) to form at least two sets of spacetiles. Of course, the method may always perform the spacetile punch process for each interconnect segment that is being implemented in some embodiments because the design actually changes dynamically with the implementation of each interconnect segment.

In some embodiments, the process 316 or 426 may comprise the process 814 of performing a search using the first set of spacetiles or the second set of spacetiles to implement the interconnect segment(s) for the second set of pins. In some embodiments, the process 316 or 426 may comprise the process 816 of implementing the remaining interconnect segment(s) for the second set of pins to form a second multi-strands of interconnects based at least in part on a criterion. In some embodiments, the criterion may comprise the second strand number identified at 812 or one or more requirements, etc. as those described for 808 above. In some embodiments, the process 316 or 426 may comprise the process 818 of determining whether the first multi-strands of interconnects intersect the second multi-strands of interconnects.

In some of these embodiments where the process 818 determines that these two multi-strands of interconnects do intersect each other (e.g., one interconnect segment from the first multi-strands intersects one or more interconnect segments in the second multi-strands or vice versa), the process 818 may strap the first multi-strands and the second multi-strands at the intersection(s). At 820, the process 316 or 426 may go to 822 if it determines that the first multi-strands do not intersect the second multi-strands. FIGS. 15A-D illustrate some examples of this determining and strapping processes.

For example, the method may implement the first multi-strands 1510A connected to pin 1502A (or 1510D to 1514D, 1508D, and 1516D in FIG. 15D) and the second multi-strands 1014A connected to pin 1504A (or 1512D to 1504D in FIG. 15D) and find that these two multi-strands intersect. The process 820 may identify the intersections and strap the first multi-strands 1510A (or 1510D in FIG. 15D) and the second multi-strands 1514A (or 1512D in FIG. 15D) by using, for example, a via 1508A or 1506A (or 1506D in FIG. 15D) if the electronic design includes a horizontal routing layer in which the second multi-strands 1514A reside and a vertical routing layer in which the first multi-strands 1510A reside. Nonetheless, the first set 1520B does not intersect the second set 1514B in Fig. B. Therefore, the process 820 goes to 822 in this example shown in FIG. 15B. The intersections and thus the completion of the implementation of interconnects between 1504B and 1502B are subsequently achieved by implementing the third multi-strands of interconnects 1510B with, for example, vias 1508B, 1506B, etc.

Referring back to FIG. 8, In some embodiments where the process 820 determines that the first multi-strands do not intersect the second multi-strands, the process 316 or 426 may comprise the process 822 of identifying a bridging strand number based at least in part upon the first strand number and the second strand number. In some of these embodiments, the process 822 may identify the smaller number or the larger number between the first strand number and the second strand number as the bridging strand number. In some embodiments, the process 822 may identify any number as the bridging strand number based at least in part upon, for example but not limited to, the electrical requirement(s) (e.g., current densities, EM limits, noise, parasitics, timing etc.), the physical requirement(s) (e.g., spacing, congestion, width, etc.) or other requirement(s) (e.g., yield, manufacturability, etc.)

In some embodiments, the process 316 or 426 may comprise the process 824 of identifying a first interconnect segment from the first multi-strands and a second interconnect segment from the second multi-strands. In some embodiments, the process 316 or 426 may comprise the process 826 of identifying a second interconnect segment from the second multi-strands on interconnect segments. In some of these embodiments, the processes 824 and 826 may identify any specific interconnect segment from each set in any order.

In some embodiments, the process 316 or 426 may comprise the process 828 of implementing a first bridging interconnect segment that joins or intersects both the first interconnect segment of the first multi-strands and the second interconnect segment of the second multi-strand by using a second set of spacetiles. In some embodiments, the process 316 or 426 may comprise the process 830 of implementing the remaining multi-strands interconnect segment(s), if any, to bridge one or more interconnect segments from the first multi-strands and the second multi-strands. In some embodiments, the process 316 or 426 may comprise the process 832 of strapping the first multi-strands, the second multi-strands, and the bridging interconnect segment(s) by using, for example, vias.

Figure 9D:
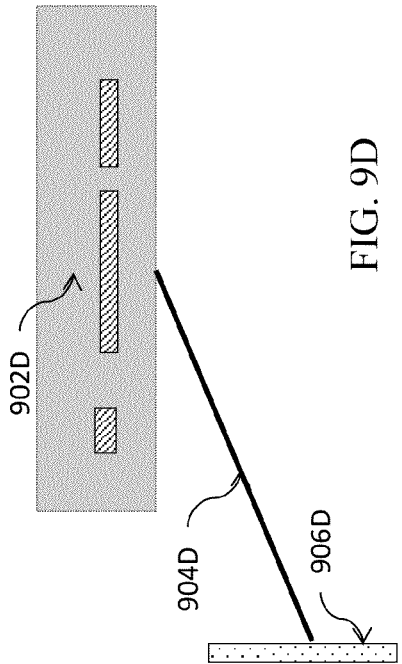

FIGS. 9A-D illustrate some typical cases of routing strands of interconnects between two pins in some embodiments. FIG. 9A illustrates a horizontal pin 902A, a vertical pin 906A, and a schematic illustration of a net 904A interconnect the two pins. FIG. 9B illustrates two vertical pins 902B and 906B that are offset both vertically and horizontally and are interconnected with a schematic illustration of a new 904B. FIG. 9C illustrates two vertical pins 902C and 906C that are offset only horizontally and are interconnected with a schematic illustration of a net 904C. FIG. 9D illustrates a single wide pin 906D and a cluster of multiple pins 902D that are interconnected with a schematic illustration of a net 904D. The single, wide pin 906D is arranged orthogonally to the cluster of multiple pins 902D in FIG. 9D. Some exemplary implementation results of interconnects for the pin arrangement shown in FIGS. 9A-D are illustrated in FIGS. 15A-D.

FIG. 10 illustrates an example for routing between two wide pins in an area including some blockages in some embodiments. More specifically, FIG. 10 shows a region of interest 1000 encompassing three blockage shapes, 1002, and two single, wide pins 1006 and 1004 interconnected with a schematic imaginary illustration of a net 1008. FIG. 10 also shows the horizontal direction 1018, which may be the preferred routing direction of a first routing layer, and the vertical direction 1016, which may be the preferred routing direction of a second routing layer. FIG. 10 also shows a few, but not all, exemplary spacetiles, 1010, 1006, 1012, and 1014, that may be determined by a spacetile punch process and/or a spacetile partitioning process.

Figure 11:
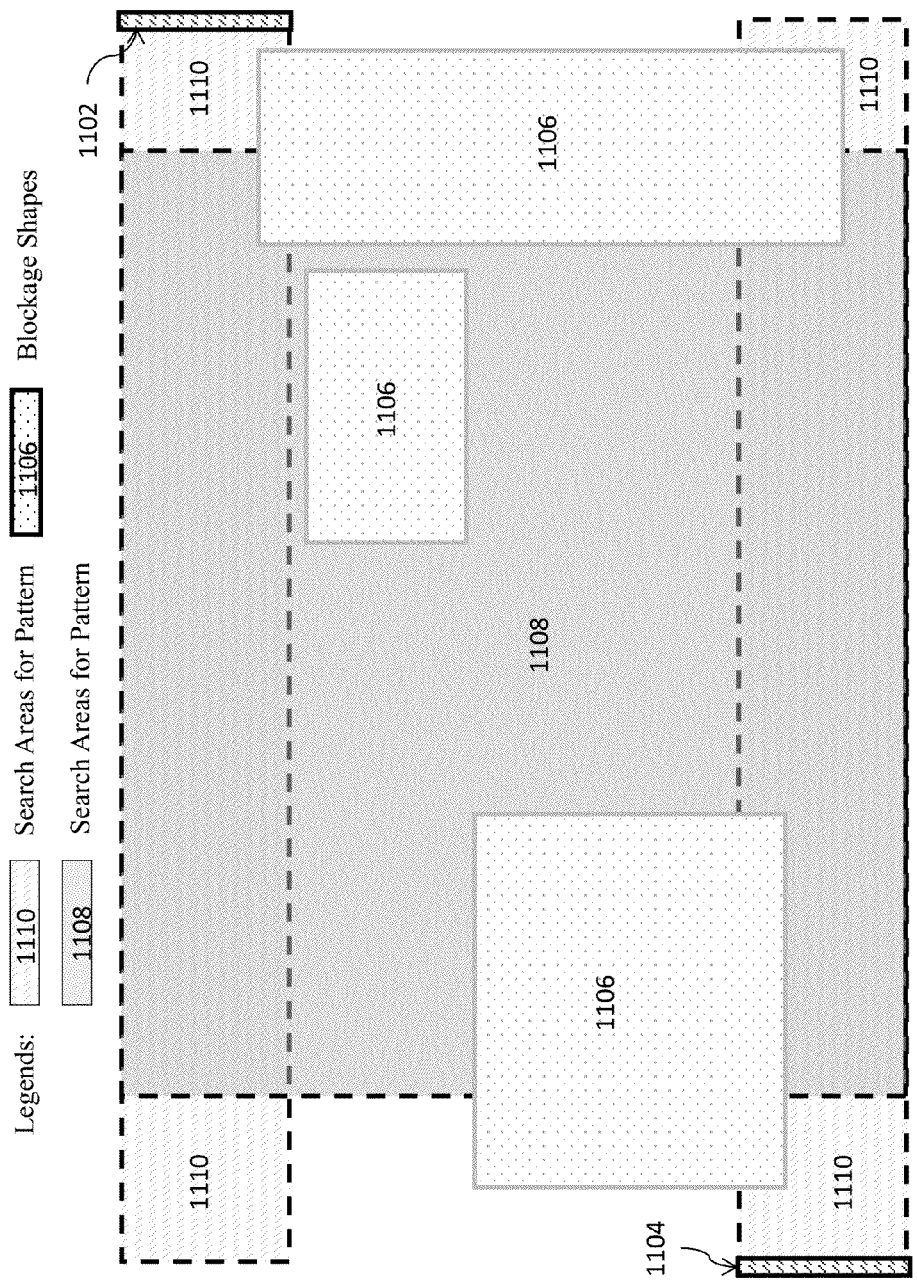
FIG. 11 illustrates more details about the example for routing between two wide pins in an area including some blockages shown in FIG. 10 in some embodiments.

FIG. 11 illustrates more details about the example for routing between two wide pins in an area including some blockages shown in FIG. 10 in some embodiments. More specifically, FIG. 11 shows the blockage shapes 1106, and two sets of search areas for routing interconnects, 1110 and 1108 which overlap one another. The areas occupied by the blockage shapes 1106 represent unavailable space for the search for viable routing solutions. The two sets of search areas 1110 and 1108 may be determined by some of the spacetiles created by a spacetile punch process.

Figure 12:
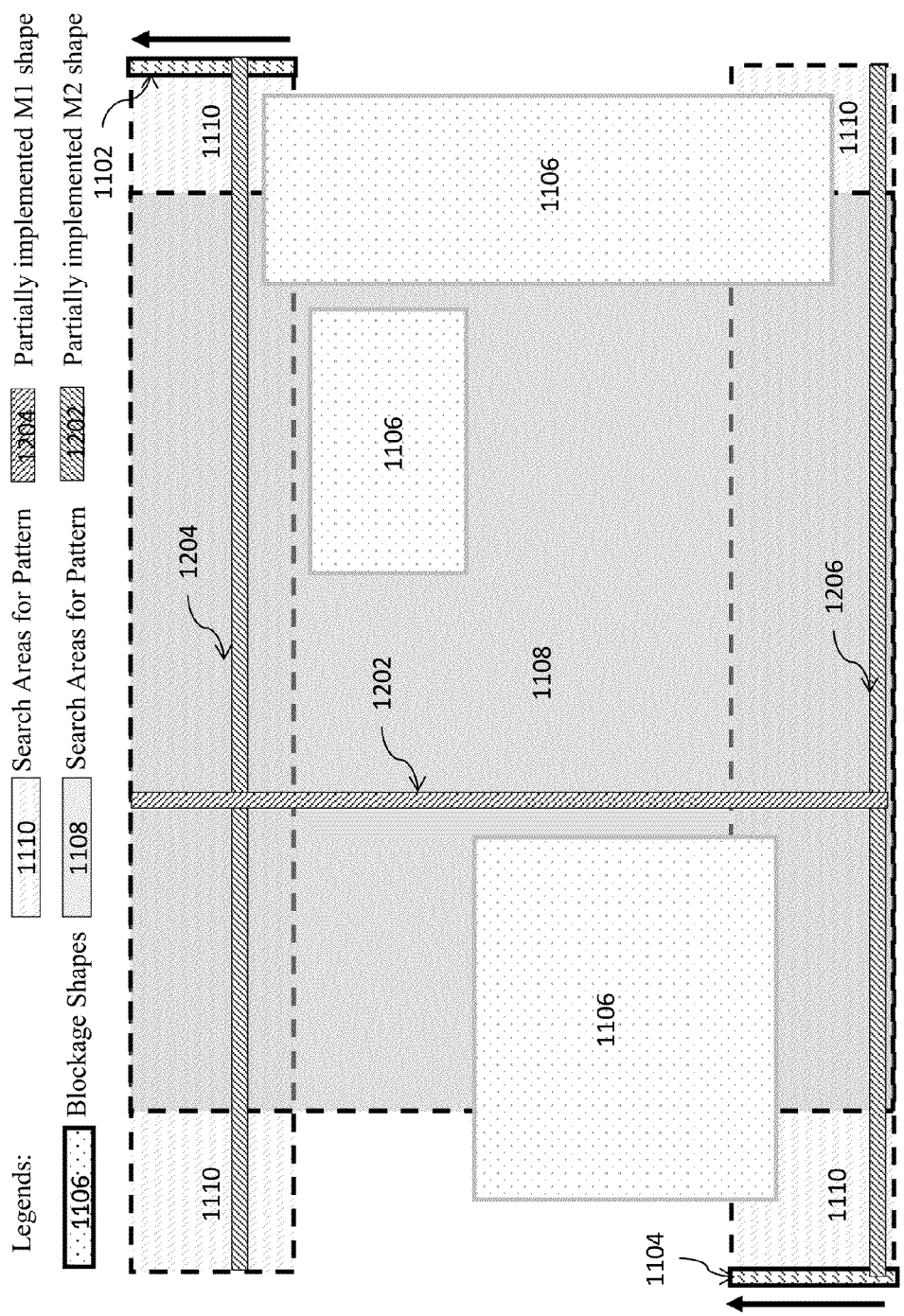
FIG. 12 illustrates more details about the example for routing between two wide pins in an area including some blockages shown in FIGS. 10-11 in some embodiments.

FIG. 12 illustrates more details about the example for routing between two wide pins in an area including some blockages shown in FIGS. 10-11 in some embodiments. More specifically, FIG. 12 shows the implementation of some exemplary interconnect segments, 1204, 1202, and 1206, by perform an area-based search with the two sets of search areas 1110 and 1108. As it may be seen from FIG. 12, the method may identify the bottom search area or spacetile 1110, start with the pin 1104, and determine where to implement the interconnect segment 1206 within the spacetile or search area 1110 across the entire spacetile or search area 1110.

The method may also perform a substantially process to implement the interconnect segment 1204 by using the upper spacetile or search area 1110 by starting at 1102 and implement the interconnect 1204 by continuing the search within the spacetile or search area 1110 until the interconnect reaches a blockage or the boundary of the spacetile 1110 or the region of interest based at least in part upon, for example, a spacing requirement between 1204 and 1106. The method may also perform a substantially similar process to implement the bridging interconnect segment 1202 by starting on either 1204 (or 1206) based at least in part upon, for example, a spacing requirement for 1202 and 1106, and continue its search in the vertical direction until the search reaches the upper boundary of the bottom 1110. The method may then identify an adjacent spacetile or search area 1108 to continue its search for a viable solution until it reaches either the end of the current spacetile or search area or the boundary of the region of interest. It shall be noted that the interconnect segments 1202, 1204, and 1206 in FIG. 12 do not represent the final implementation of these interconnect segments.

Figure 13:
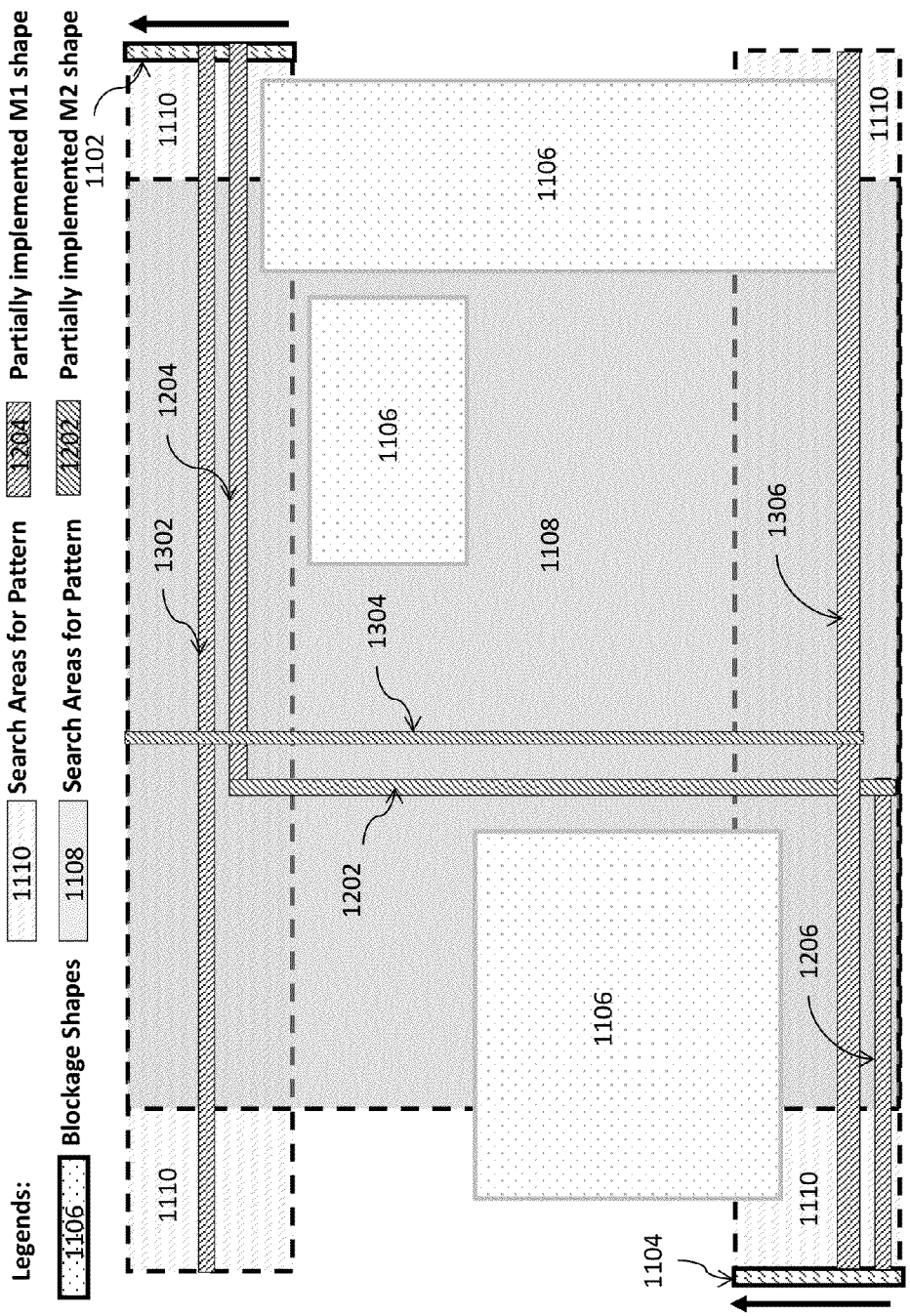
FIG. 13 illustrates more details about the example for routing between two wide pins in an area including some blockages shown in FIGS. 10-12 in some embodiments.

FIG. 13 illustrates more details about the example for routing between two wide pins in an area including some blockages shown in FIGS. 10-12 in some embodiments. More specifically, FIG. 13 shows that the interconnects 1206, 1202, and 1204 have been trimmed to appropriate lengths. In addition, FIG. 13 shows additional interconnect segments 1302, which may be implemented in a substantially similar manner, based at least in part upon, for example, a spacing requirement for 1302 and 1204, an interconnect segment 1306, which may be implemented in a substantially similar manner based at least in part upon the spacing requirement for 1306 and 1206, and another bridging interconnect segment 1304 to bridge 1302 and 1306. It shall be noted that FIG. 13 shows that 1306 is of some different width. It shall also be noted that the interconnect segments 1302, 1304, and 1306 in FIG. 13 do not represent the final implementation of these interconnect segments.

Figure 14:
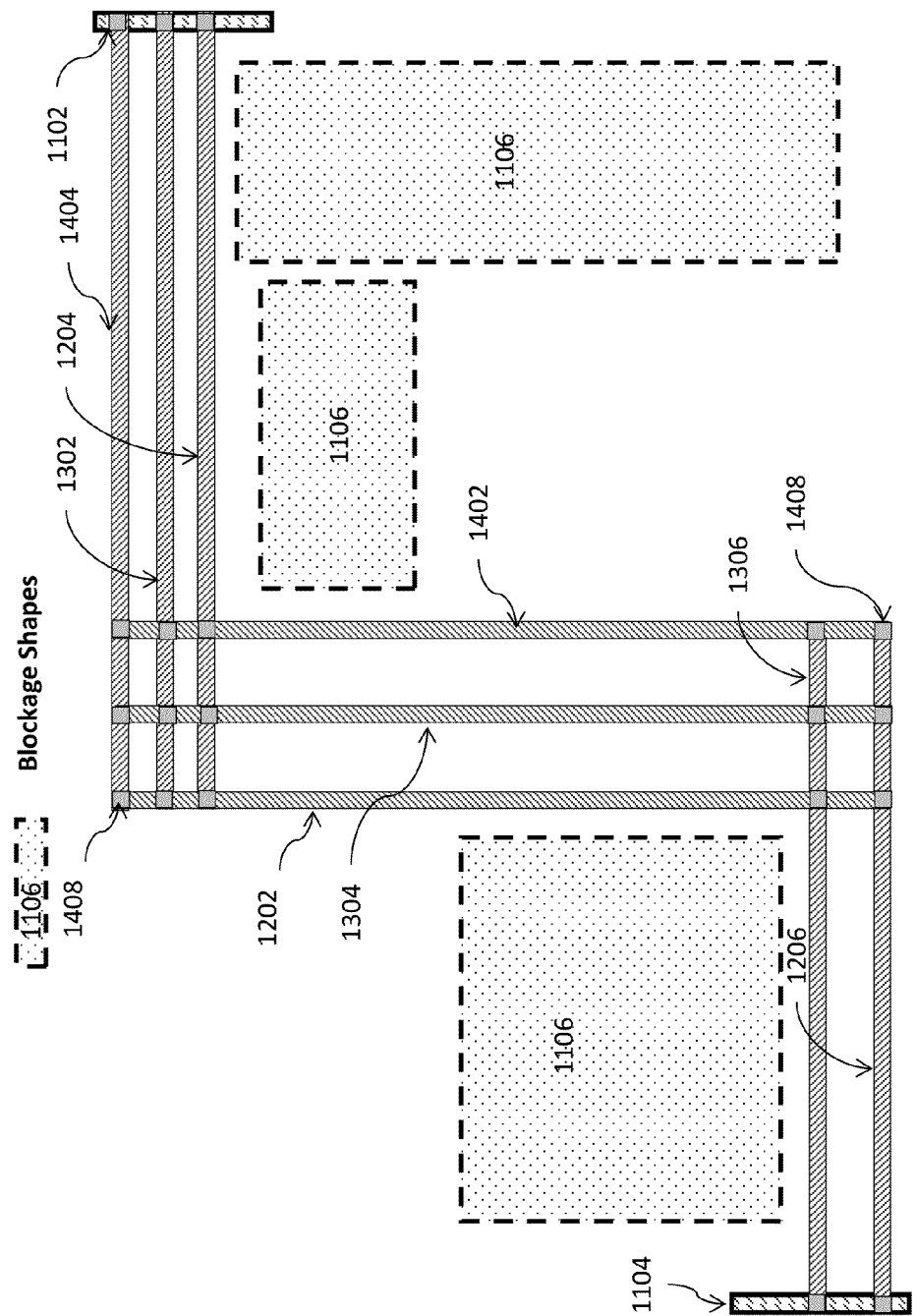
FIG. 14 illustrates more details about the example for routing between two wide pins in an area including some blockages shown in FIGS. 10-13 in some embodiments.

FIG. 14 illustrates more details about the example for routing between two wide pins in an area including some blockages shown in FIGS. 10-13 in some embodiments. More specifically, FIG. 14 illustrates a completed implementation of interconnection between the two wide pins 1104 and 1102. The multi-strands connected to the single, wide pin 1104 includes two interconnect segments—1206 and 1306. The strand number associated with pin 1104 in this example is thus two. The multi-strands connected to the single, wide pin 1102 includes three interconnect segments—1204, 1302, and 1404. The strand number associated with pin 1102 in this example is thus three. The difference in the strand number for pins 1102 and 1104 is due at least in part to the locations of the neighboring blockage shapes 1106. The bridging interconnect segments, 1202, 1304, and 1402, interconnect the two multi-strands of interconnect segments and are strapped together at each of the intersections by using, for example, vias 1408. It shall be noted that each of 1202, 1304, and 1402 intersects both the multi-strands including 1206 and 1306 and the multi-strands including 1404, 1204, and 1302 in this example. Nonetheless, it is not necessarily required to have each bridging interconnect intersect each of the other interconnects connected to the pins.

Figure 15:
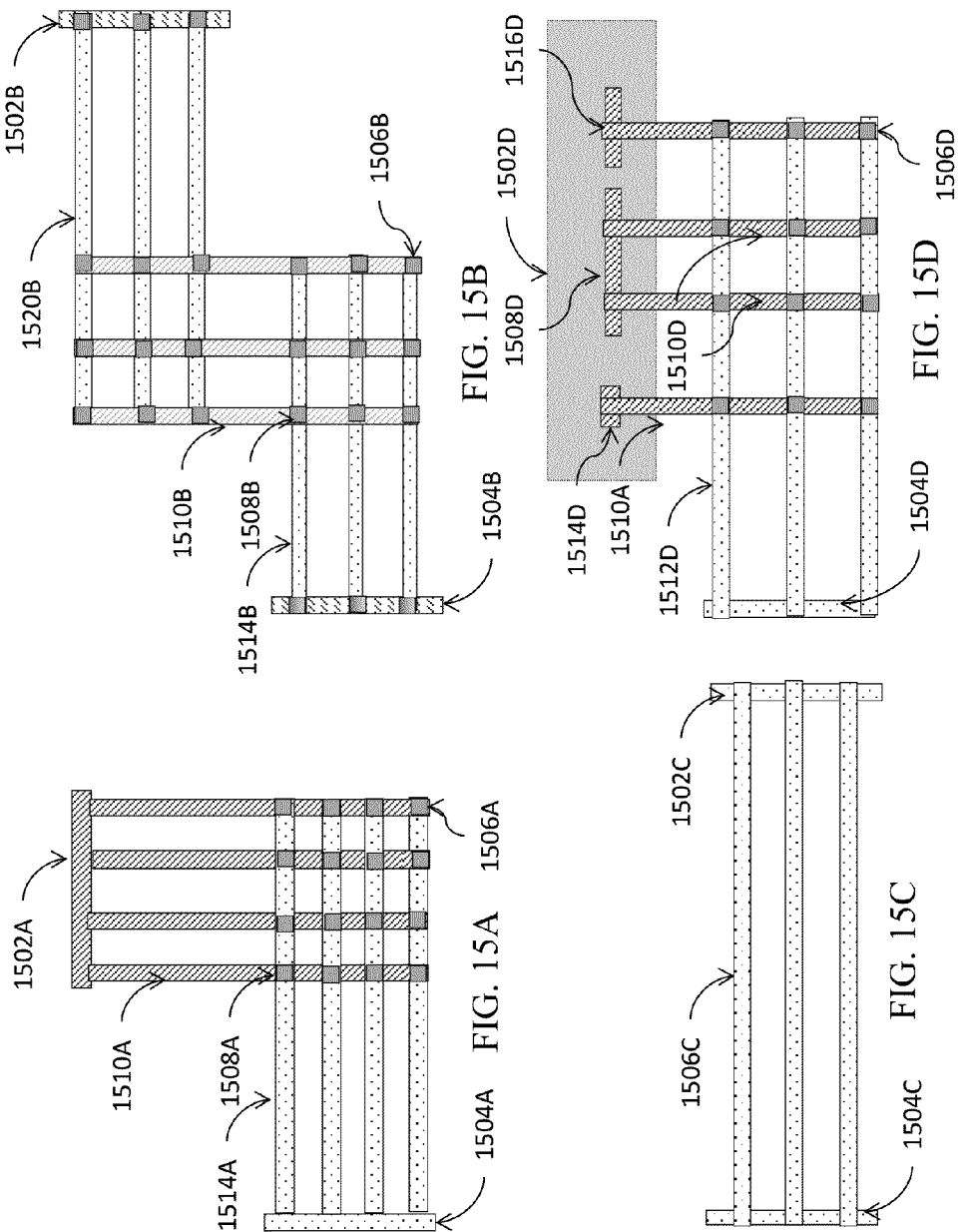
FIGS. 15A-D illustrate some exemplary results of the typical cases of routing strands of interconnects between two pins shown in FIGS. 9A-D in some embodiments.

FIGS. 15A-D illustrate some exemplary results of the typical cases of routing strands of interconnects between two pins shown in FIGS. 9A-D respectively in some embodiments. FIG. 15A illustrates two pins 1502A and 1504A with the first set of multi-strands of interconnects 1510A connected to 1502A and the second set of multi-strands of interconnects 1514A by using an L-route topology. Each interconnect in each set of multi-strands (e.g., 1510A) intersects each interconnect in the other set of multi-strands (e.g., 1514A), and a via is used to strap two intersecting interconnects at their intersections.

FIG. 15B shows two wide pins 1502B and 1504B that are both horizontally and vertically offset from each other. The first set of multi-strands of interconnects 1520B are connected to 1502B, and the second set of multi-strands of interconnects 1504B are connected to 1504B. Each bridging interconnect of the multi-strands of bridging interconnects 1510B intersects with each interconnect in the first set as well as the second set, and vias 1506B and 1508B are used to strap the intersecting interconnects at their intersections by using a Z-route topology.

FIG. 15C illustrates two vertically placed pins 1502C and 1504C that are horizontally offset from each other and are interconnected with straight interconnect segments 1506C by using a straight-routing topology. FIG. 15D shows a single, wide pin 1504D and a cluster 1502D of three pins 1514D, 1508D, and 1516D. The first set of multi-strands of interconnects 1512D are connected to the single, wide pin 1504D, and the second set of multi-strands of interconnects 1510D are connected to the respective pins in the cluster 1502D. Each interconnect segment in one of these two sets of multi-strands of interconnect segments intersects all of the interconnect segments in the other set. Vias 1506D are used to strap these intersecting interconnect segments if the electronic design includes a horizontal routing layer in which the first set of multi-strands of interconnects 1512D resides and a vertical routing layer in which the second set of multi-strands of interconnects 1510D resides, and if the horizontal routing layer is not allowed to have vertical interconnects, and the vertical routing layer is not allowed to have horizontal interconnects. In some embodiments where a single routing layer is permitted to have interconnects in both the preferred and non-preferred routing directions, no vias will be needed to strap the intersecting interconnect segments.

Figure 16:
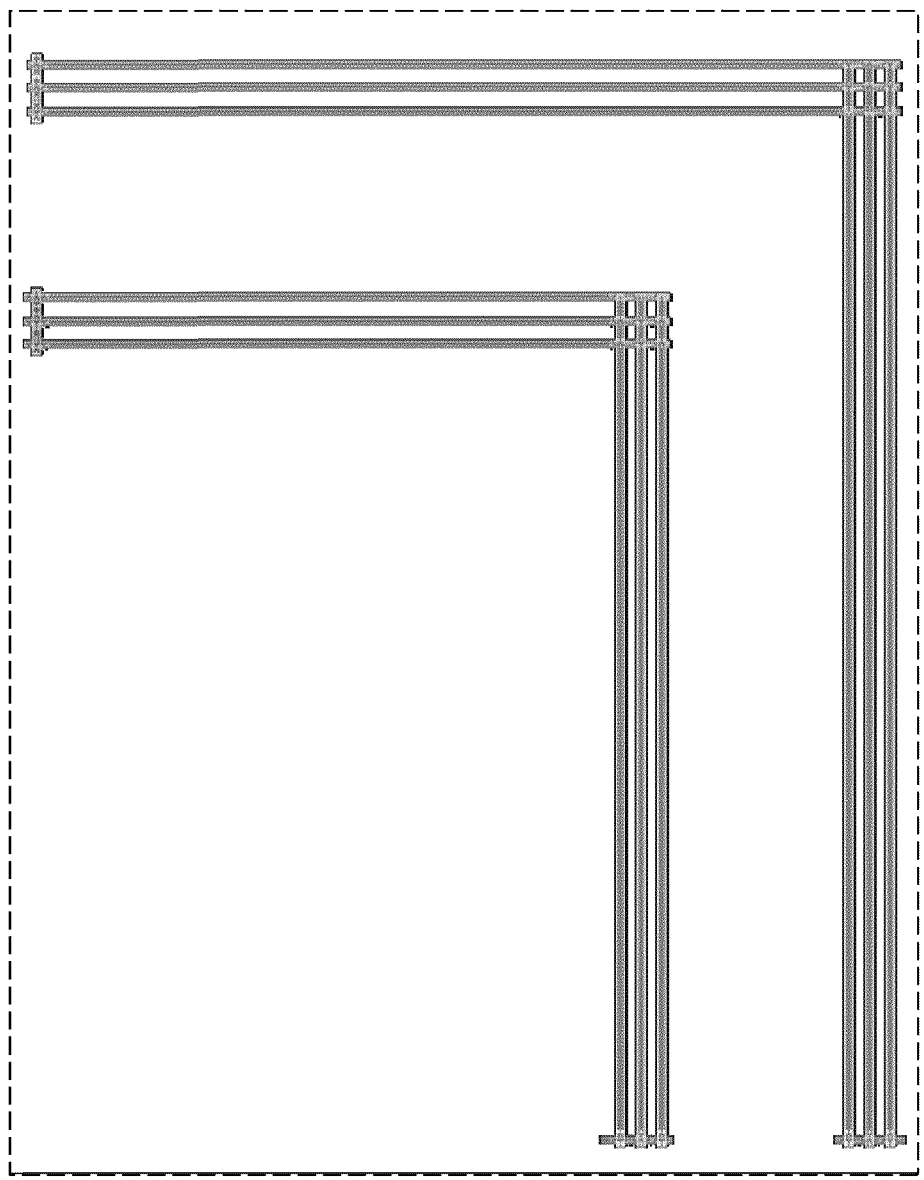
FIG. 16 illustrates some exemplary strand routing results between pins using the L-route in some embodiments.

FIG. 16 illustrates some exemplary strand routing results between pins using the L-route in some embodiments. That is, in the two nets shown in FIG. 16, the method may adopt the L-routing topology to implement the interconnect segments between a source pin and a destination pin. The strand number for each of the four pins in FIG. 16 is three. Also note that each interconnect in one direction of each net intersects all the other interconnects in the other direction.

Figure 17:
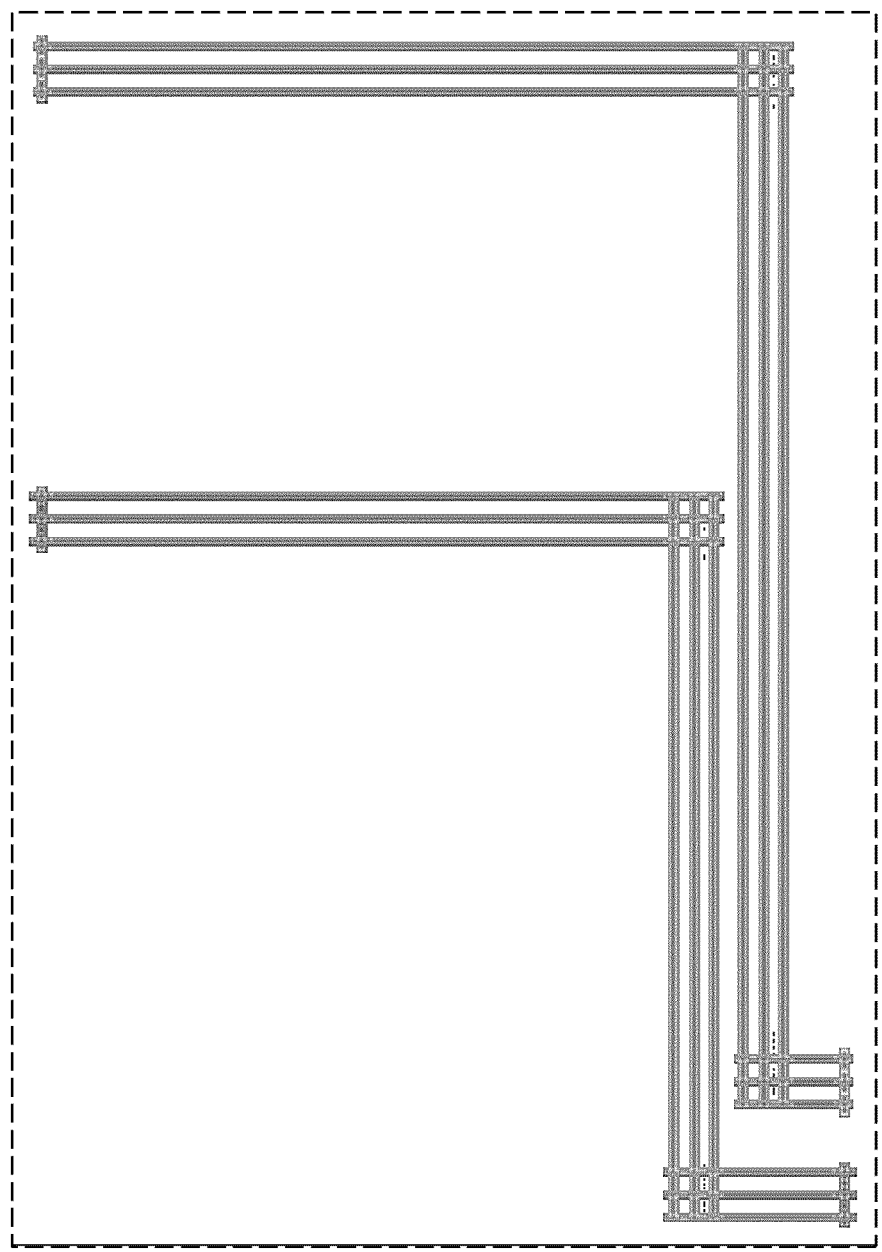
FIG. 17 illustrates some exemplary strand routing results between pins using the Z-route in some embodiments.

FIG. 17 illustrates some exemplary strand routing results between pins using the Z-route in some embodiments. That is, in the two nets shown in FIG. 17, the method may adopt the Z-routing topology to implement the interconnect segments between a source pin and a destination pin. Also note that each interconnect in one set of multi-strands of interconnects of a net intersects all the other interconnects in the other two sets of multi-strands of interconnects. The strand number for each of the four pins in FIG. 17 is also three.

Figure 18:
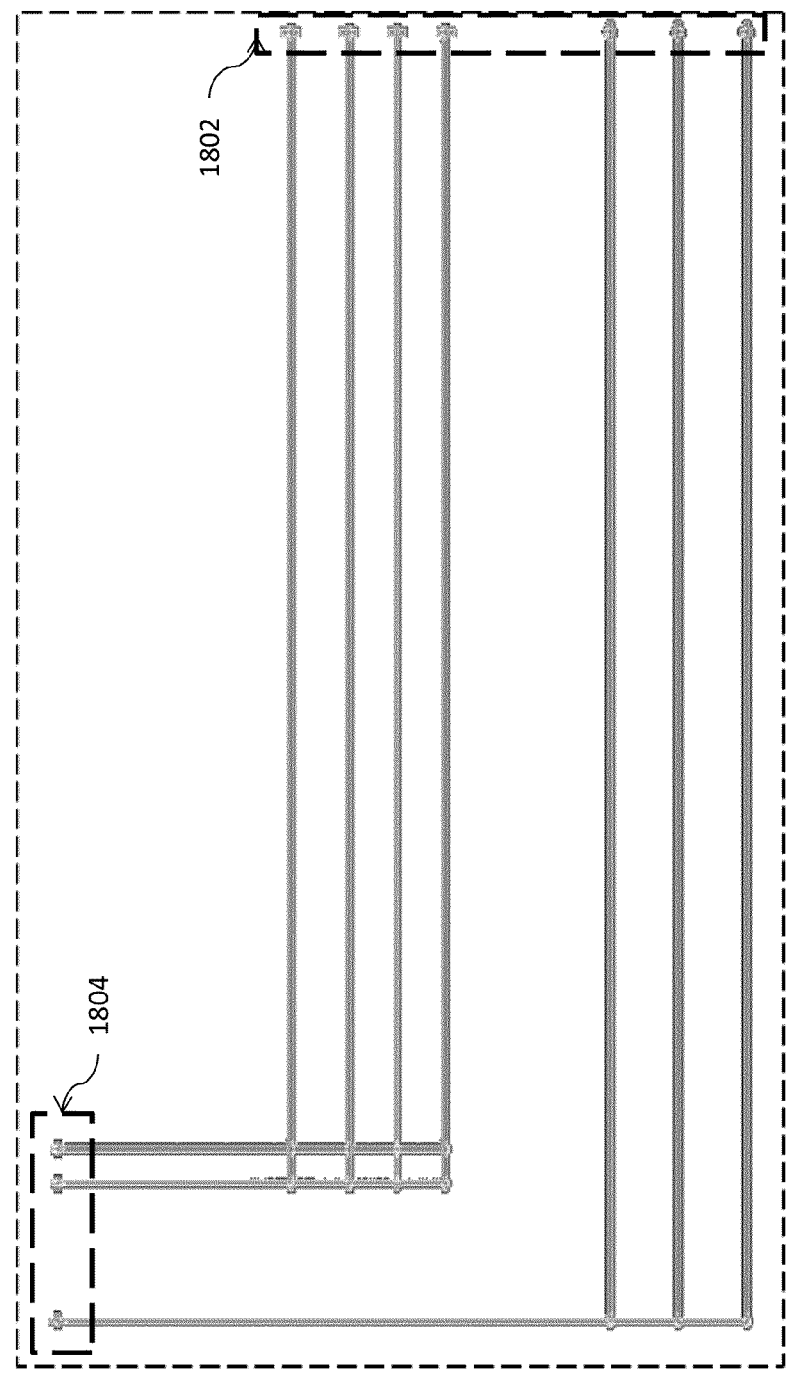
FIG. 18 illustrates some exemplary multi-port to multi-port strand routing results using the L-route in some embodiments.

FIG. 18 illustrates some exemplary multi-port to multi-port strand routing results using the L-route in some embodiments. The first multi-port 1804 includes three pins, and the second multi-port 1802 includes seven pins. The method selects the L-routing topology to implement the interconnect segments in FIG. 18 based on the arrangement or relative position of the two multi-ports 1802 and 1804.

Figure 19:
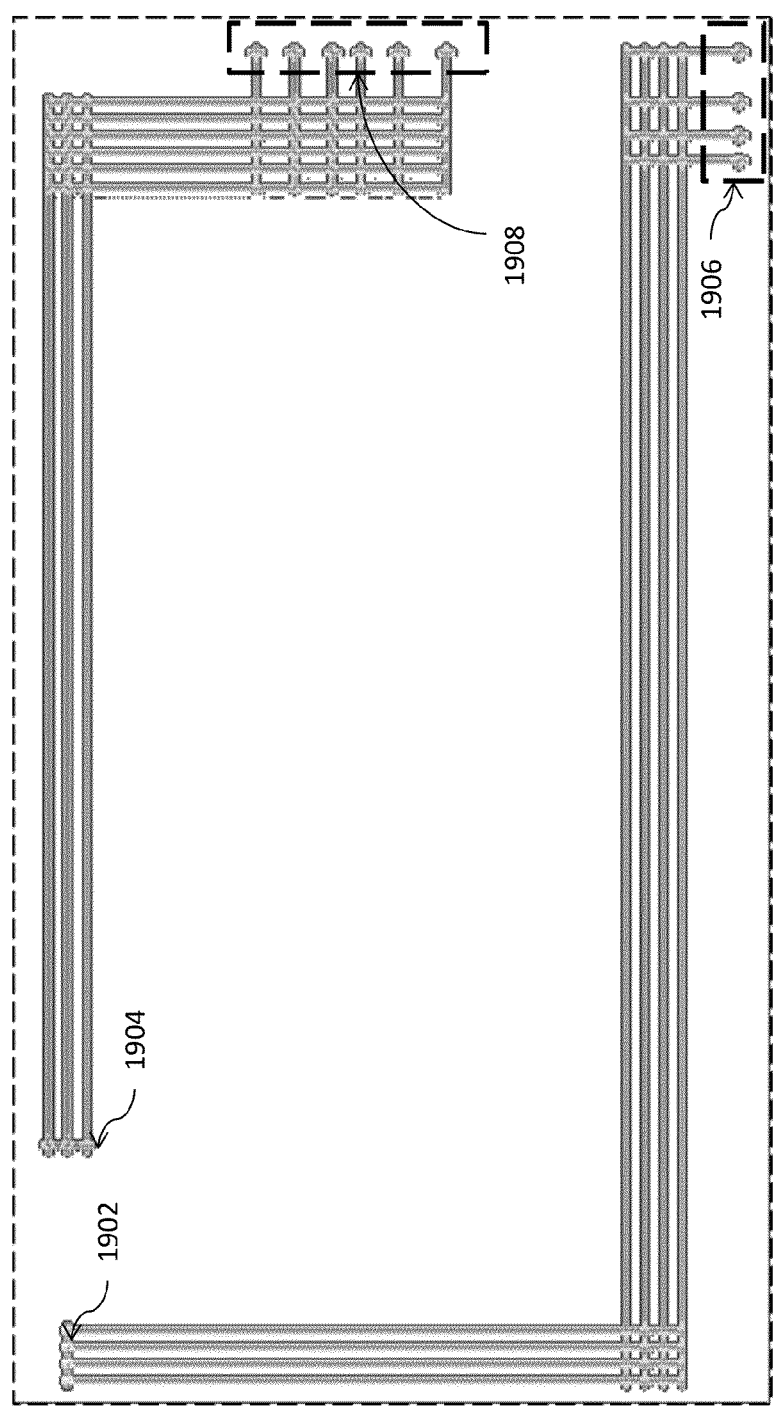
FIG. 19 illustrates two exemplary multi-port to single-port strand routing results using the Z-route in some embodiments.

FIG. 19 illustrates two exemplary multi-port to single-port strand routing results using the Z-route in some embodiments. More specifically, each of 1902 and 1904 represents a single, wide pin, and each of 1906 and 1908 represents a cluster of multiple pins. As shown in FIG. 19, cluster 1908 includes six pins, and cluster 1906 includes four pins. The method chooses Z-routing topology to implement the two nets. Moreover, the net interconnecting 1902 and 1906 has the strand number of four throughout the entire net, whereas the net interconnecting 1904 and 1908 has two different strand numbers—three and six.

Figure 20:
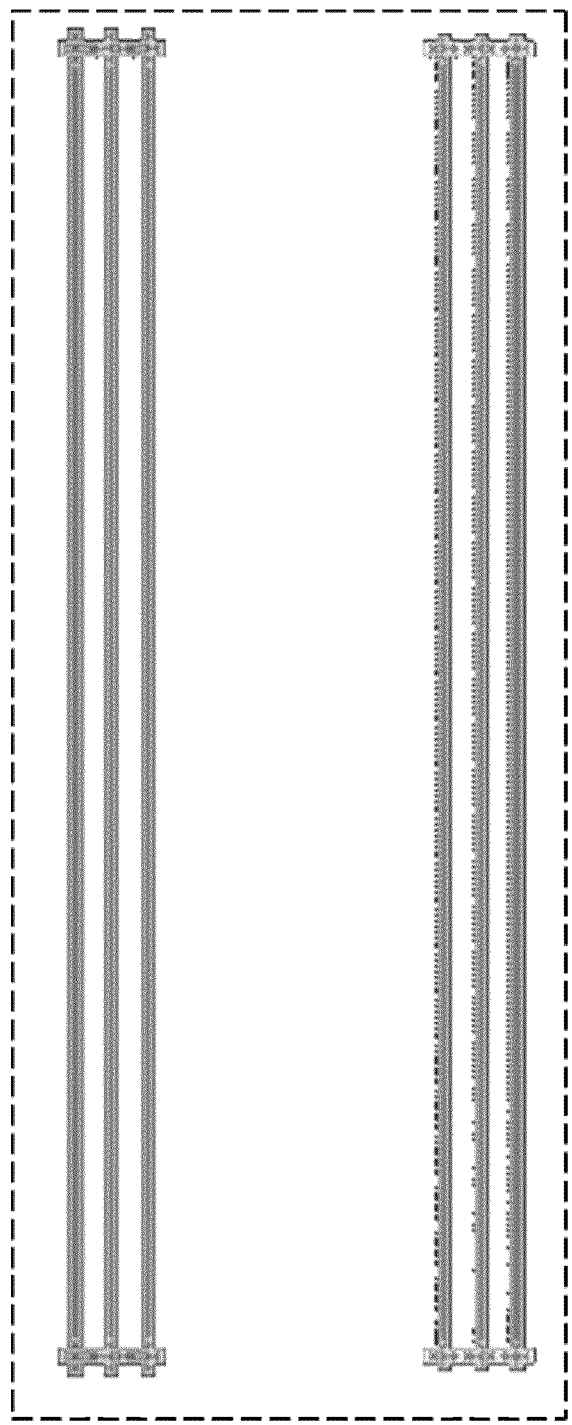
FIG. 20 illustrates some exemplary strand routing results using the straight-line route in some embodiments.

FIG. 20 illustrates some exemplary strand routing results using the straight-line route in some embodiments. The method chose the straight-route topology in implementing the two nets shown in FIG. 20 with a strand number of three for each net.

Figure 21:
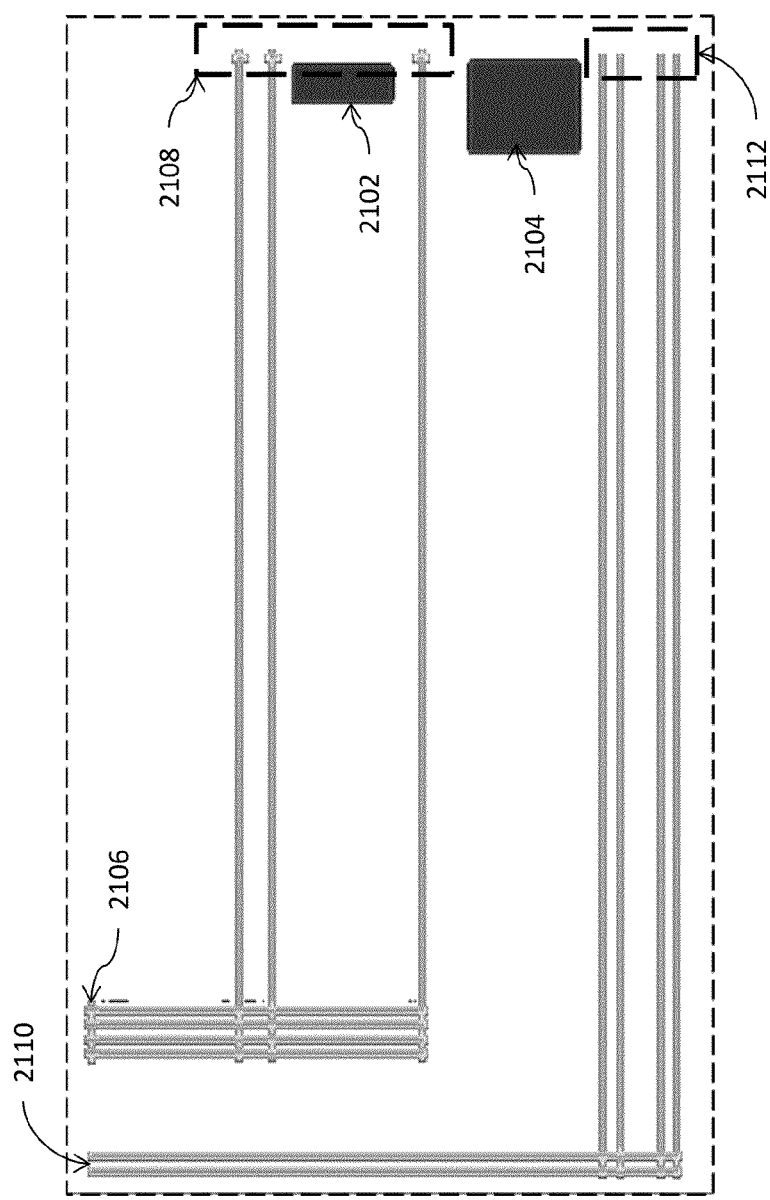
FIG. 21 illustrates some exemplary search based patterns with blockage shapes in some embodiments.
Figure 22:
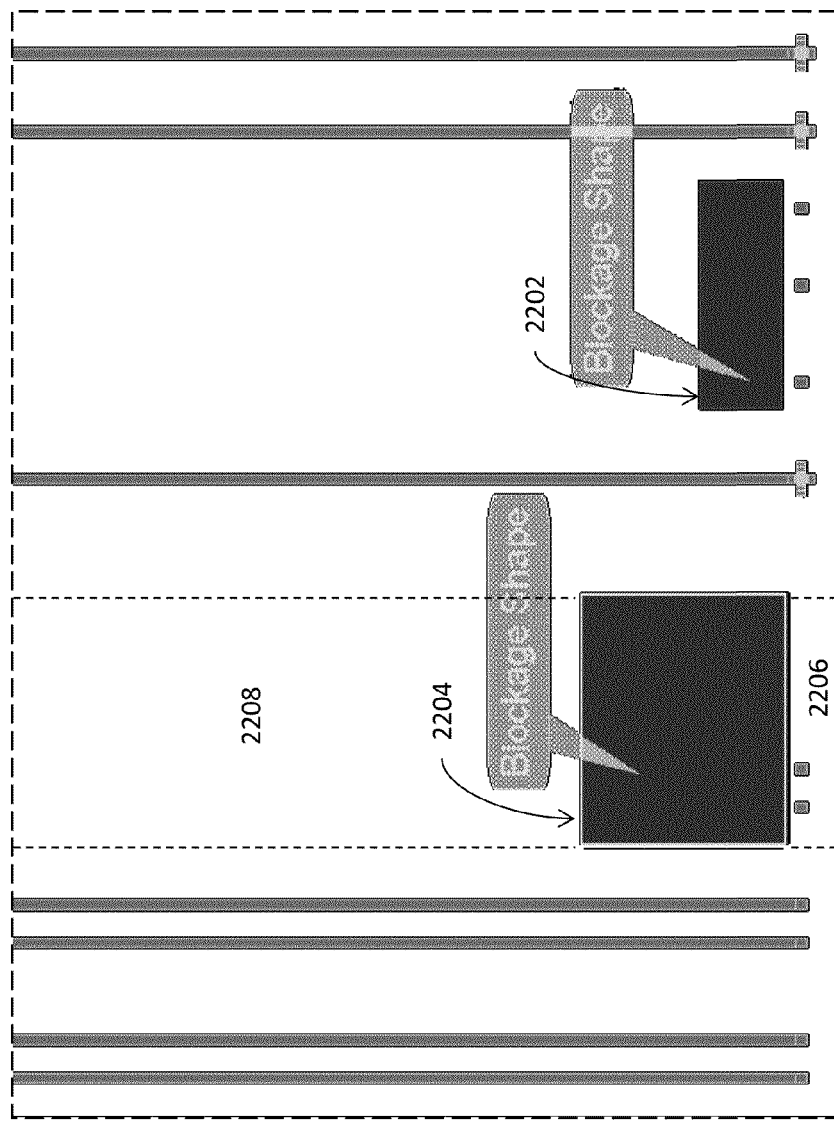
FIG. 22 illustrates some exemplary search based patterns with blockage shapes in some embodiments.

FIG. 21 illustrates some exemplary search based patterns with blockage shapes in some embodiments. More specifically, FIG. 21 shows the multi-port-to-multi-port net between the cluster of two pins 2110 and the cluster of four pins 2112 and the multi-port-to-single port net between the cluster 2108 of three pins and the single, wide pin 2106. FIG. 21 also shows the presence of two blockage shapes 2102 and 2104 that results in uneven spacing among the interconnect segments connected to 2108. The interconnect segments connected to 2112 also shows uneven spacing that may be due to a design choice or other requirement(s).

For example, even if the process selects the areas or spacetiles 2206 and 2208 to initiate the search for viable solution in some embodiments, the search will find that these two spacetiles or areas do not provide viable solutions due to the presence of the blockage shape 2204 because the search does not result in a solution that leads to the destination or the boundary of the region of interest. In some embodiments, the spacetiles such as 2206 and 2208 will be removed from the set of live spacetiles before the initiation of the search as described above such that the method will not identify such spacetiles or areas for the search for viable solutions. Similarly, one or more other spacetiles may also be removed due the presence of the blockage shape 2202 in these embodiments.

It shall be noted that although the Manhattan grid is used in the above examples, various embodiments described herein shall not be limited as such, and that various embodiments also apply with full and equal effects to electronic circuit designs with oblique interconnects (e.g., 45-degree or 135-degree route segments). It shall also be noted that although the Manhattan grid is used in the above examples, various embodiments described herein shall not be limited to gridded electronic circuit designs because the Manhattan grid is used in the above example to provide reference to directions for describing the relationships between an aggressor and the region of interest or the spacetile, and that various embodiments also apply with full and equal effects to gridded and gridless as well as tracked and trackless electronic circuit designs.

In some embodiments, the identified layer may comprise tracks. A track may comprise a line of zero thickness on which the centerline of an interconnect lies. In some embodiments where a preferred or default routing direction is defined, a track along the preferred or default routing direction is called a right-way track. A track that does not lie along the preferred or default routing direction is called a wrong-way track in these embodiments. It shall be noted that the aforementioned definitions of right-way tracks and wrong-way tracks are not limited to Manhattan routing directions that are perpendicular to each other and may also applied to two routing directions at an oblique angle for a given layer.

In some embodiments where a layer is associated with some tracks, the layer may be deemed "tracked" or "track-based", which are used interchangeably in this application. A layer will be deemed trackless or not track-based if the layer is not associated with any tracks (e.g., no right-way tracks and wrong-way tracks.) In some embodiments where a layer is associated with both the right-way tracks and the wrong-way tracks, the layer may be deemed as gridded or grid-based. In these embodiments, a grid is defined by the intersection of a right-way track and a wrong-way track. If a layer is associated with only one set of tracks (e.g., right-way tracks) but not the other (e.g., wrong-way tracks), the layer may be deemed gridless or not grid-based. Therefore, a gridded layer is always tracked because a gridded layer requires the tracks in the preferred or default routing direction (e.g., right-way tracks) and in the other direction (e.g., wrong-way tracks) to determine the grids, which are the intersections of the two sets of tracks. On the other hand, a gridless layer may be tracked or trackless because a gridless layer may contain only one set of tracks (e.g., the right-way tracks) or no tracks at all. In some embodiments where a gridless layer contains only one set of tracks, the layer is nonetheless tracked or track based. In some other embodiments where a gridless layer contains no tracks at all in either direction, the gridless layer is also trackless.

It shall be noted that various embodiments disclosed herein apply with full and equal effects to any tracked or trackless layer and also to any gridded or gridless layer. If shall also be noted that various embodiments disclosed herein apply with equal effect to a layer which may include tracks (right-way tracks or both right-way and wrong-way tracks) in a smaller portion of the layer whereas the remainder of the layer is trackless. If shall also be noted that various embodiments disclosed herein apply with equal effect to a layer which may be gridded in a smaller portion of the layer whereas the remainder of the layer is gridless or even trackless.

On the other hand, a trackless layer is always gridless because there exist no tracks at all on the layer to form grids. If shall also be noted that various embodiments disclosed herein apply with equal effect to a layer which may include non-uniform tracks or non-uniform grids in some embodiments. These embodiments do not require uniform tracks or uniform grids for achieving the all the intended purposes. Some embodiments further distinguish between a soft track and a hard track. A hard track is enforced by one or more design rules that require an interconnect to stay on a track and prohibit any off-track interconnects. A soft track may be enforced by one or more design rules that require an interconnect to stay on a track to the extent possible and may allow some off-track interconnects if the on-track requirements cannot be successfully enforced without increasing, for example, the cost, difficulty, etc. beyond some permissible thresholds or without causing other violations of, for example, one or more design rules.

It shall also be noted that the grids described herein may refer to the routing grids, which are formed by electronic design automation (EDA) tools while routing an electronic design. A place and route tool may then place and route among the routing grids, which may be defined by the EDA tools, the circuit designers, or the design rules. A placement tool may also define or use placement grids, which may be determined to be multiples of the size of the manufacturing grids, to align cells, macros, blocks, etc. in the design.

Manufacturing grids are defined by the foundries that reference the manufacturing grids, for example, for mask design and manufacturing to fabricate the electronic circuits according to their designs. Manufacturing grids are process specific because these grids usually represent the resolution threshold for specific manufacturing processes and are usually specified in technology files or a file that includes a specification for representing the physical layout of an electronic circuit (e.g., an LEF (library exchange format) file.) A typical manufacturing grid for 0.18 micron technology nodes is 5 nanometers. In other words, manufacturing grids exist because these grids are imposed by the foundries, and manufacturing grids are usually uniform. Unless otherwise expressly specified, a grid or grids refer to a routing grid or routing grids in this application. Nonetheless, it shall be noted that some embodiments may leverage the existing of the manufacturing grids to achieve various intended purposes because such manufacturing grids are imposed by the foundries.

System Architecture Overview

Figure 23:
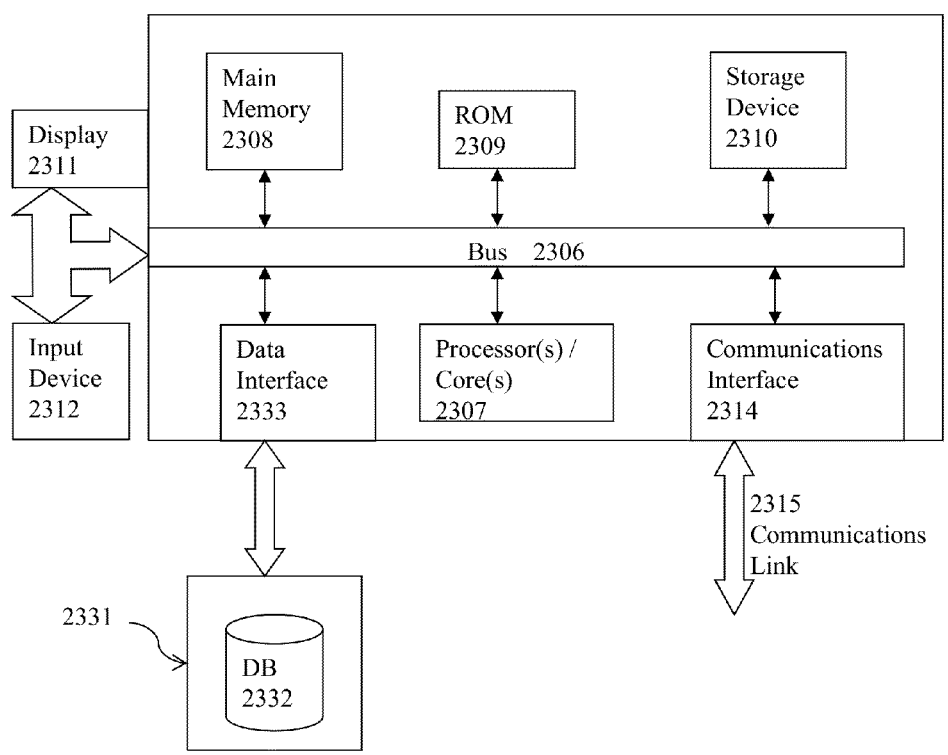
FIG. 23 illustrates a computerized system on which a method for implementing multi-layer local maximal spanning routing paths may be implemented.

FIG. 23 illustrates a block diagram of an illustrative computing system 2300 suitable for implementing a physical electronic circuit design with multiple-patterning techniques as described in the preceding paragraphs with reference to various figures. Computer system 2300 includes a bus 2306 or other communication mechanism for communicating information, which interconnects subsystems and devices, such as processor 2307, system memory 2308 (e.g., RAM), static storage device 2309 (e.g., ROM), disk drive 2310 (e.g., magnetic or optical), communication interface 2314 (e.g., modem or Ethernet card), display 2311 (e.g., CRT or LCD), input device 2312 (e.g., keyboard), and cursor control (not shown).

According to one embodiment, computer system 2300 performs specific operations by one or more processor or processor cores 2307 executing one or more sequences of one or more instructions contained in system memory 2308. Such instructions may be read into system memory 2308 from another computer readable/usable storage medium, such as static storage device 2309 or disk drive 2310. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 2307, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof. In one embodiment, the parasitic extraction, current solving, current density computation and current or current density verification is done in memory as layout objects or nets are created or modified.

The term "computer readable storage medium" or "computer usable storage medium" as used herein refers to any medium that participates in providing instructions to processor 2307 for execution. Such a medium may take many forms, including but not limited to, non-volatile media and volatile media. Non-volatile media includes, for example, optical or magnetic disks, such as disk drive 2310. Volatile media includes dynamic memory, such as system memory 2308.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 2300. According to other embodiments of the invention, two or more computer systems 2300 coupled by communication link 2315 (e.g., LAN, PTSN, or wireless network) may perform the sequence of instructions required to practice the invention in coordination with one another.

Computer system 2300 may transmit and receive messages, data, and instructions, including program, i.e., application code, through communication link 2315 and communication interface 2314. Received program code may be executed by processor 2307 as it is received, and/or stored in disk drive 2310, or other non-volatile storage for later execution. In an embodiment, the computer system 2300 operates in conjunction with a data storage system 2331, e.g., a data storage system 2331 that contains a database 2332 that is readily accessible by the computer system 2300. The computer system 2300 communicates with the data storage system 2331 through a data interface 2333. A data interface 2333, which is coupled to the bus 2306, transmits and receives electrical, electromagnetic or optical signals that include data streams representing various types of signal information, e.g., instructions, messages and data. In embodiments of the invention, the functions of the data interface 2333 may be performed by the communication interface 2314.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for implementing current carrying interconnects in an electronic design, comprising:
   using at least one processor or at least one processor core of an electronic design automation (EDA) system to perform a process, the process comprising:
   identifying a first pin and a second pin of a plurality of pins in the electronic design;
   determining or identifying an available area for interconnecting the first pin and the second pin by analyzing a region of interest; and
   implementing a first interconnect for the first pin based at least in part upon a first strand number for the first interconnect used to connect the first pin and the second pin and an electric current requirement, rather than upon changing a width of the first interconnect for the first pin.

2. The computer implemented method of claim 1, wherein the act of implementing the first interconnect for the first pin is based further at least in part upon a routing topology, one or more requirements, or a second strand number.

3. The computer implemented method of claim 2, the process further comprising:
determining or identifying the routing topology based at least in part upon a characteristic of the first pin and the second pin of the plurality of pins.

4. The computer implemented method of claim 2, the one or more requirements comprising a physical requirement, an electrical requirement, a performance requirement, a manufacturing requirement, or a functionality of the first interconnect in the electronic design.

5. The computer implemented method of claim 3, the characteristic comprises a first position of the first pin and a second position of the second pin, a first orientation of the first pin and a second orientation of the second pin, or relative orientation of the first pin and the second pin.

6. The computer implemented method of claim 1, wherein the act of implementing the first interconnect for the first pin is based further at least in part upon an area-based search strategy.

7. The computer implemented method of claim 1, the process further comprising:
clustering multiple pins of the plurality of pins to form a single pin.

8. The computer implemented method of claim 7, wherein the act of clustering the multiple pins comprises:
identifying a threshold requirement of proximity between two adjacent pins of the multiple pins;
identifying the multiple pins based at least in part upon the threshold requirement of proximity; and
clustering the multiple pins into the single pin based at least in part upon an area match or a boundary match.

9. The computer implemented method of claim 1, the process further comprising:
strapping the first interconnect for the first pin and a second interconnect for the second pin at an intersection of the first interconnect and the second interconnect.

10. The computer implemented method of claim 1, the process further comprising:
identifying a blockage in the region of interest; and
determining whether the blockage can be modified.

11. The computer implemented method of claim 1, the process further comprising:
determining or identifying one or more first valid intervals for the region of interest.

12. The computer implemented method of claim 11, the act of determining or identifying the one or more first valid intervals comprising:
identifying a first boundary segment of the region of interest;
projecting one or more geometries of the electronic design onto the first boundary to form one or more projected geometries along the first boundary;
fragmenting the first boundary based at least in part upon the one or more projected geometries; and
identifying the one or more first valid intervals in the region of interest based at least in part upon a fragmentation result of the first boundary.

13. The computer implemented method of claim 11, the act of determining or identifying the one or more first valid intervals comprising:
generating a first set of spacetiles by at least performing a spacetile punch for the region of interest;
identifying a first boundary of the region of interest based at least in part upon the first pin or the second pin; and
identifying or determining the one or more first valid intervals with respect to the first boundary based at least in part upon analyzing at least some of the first set of spacetiles.

14. The computer implemented method of claim 13, the act of determining or identifying the one or more first valid intervals further comprising:
partitioning a spacetile of the first set of spacetiles into multiple finer spacetiles.

15. The computer implemented method of claim 13, the act of determining or identifying the one or more first valid intervals further comprising:
creating one or more area probes by using at least some of the first set of spacetiles.

16. The computer implemented method of claim 1, wherein the act of implementing the first interconnect comprises:
performing an area-based search using at least one spacetile of a first set of spacetiles to identify a first routing solution from the first pin; and
implementing the first interconnect for the first pin by using at least the first routing solution.

17. The computer implemented method of claim 16, wherein the process further comprises:
identifying a second strand number for the second pin;
determining whether the first set of spacetiles is to be used to implement a second interconnect for the second pin;
generating a second set of spacetiles by at least performing a spacetile punch for the region of interest where the first set of spacetiles is determined not to be used to implement the second interconnect for the second pin;
performing the area-based search by using at least the first set of spacetiles or the second set of spacetiles to generate a second routing solution for the second pin; and
implementing the second interconnect for the second pin by using at least the second routing solution.

18. The computer implemented method of claim 16, wherein the process further comprises:
performing the area-based search by using at least the first set of spacetiles or a second set of spacetiles to generate a bridging routing solution for the second pin;
implementing a third interconnect to bridge the first interconnect and a second interconnect by using at least the bridging routing solution;
strapping the first interconnect and the third interconnect at a first intersection of the first interconnect and the third interconnect; and
strapping the second interconnect and the third interconnect at a second intersection of the second interconnect and the third interconnect.

19. A system for implementing high current carrying interconnects in an electronic design, comprising:
at least one processor or at least one processor core of an electronic design automation (EDA) system that is at least to:
identify a first pin and a second pin of a plurality of pins in the electronic design;
determine or identify an available area for interconnecting the first pin and the second pin by analyzing a region of interest; and
implement a first interconnect for the first pin based at least in part upon a first strand number for the first interconnect used to connect the first pin and the second pin and an electric current requirement, rather than upon changing a width of the first interconnect for the first pin.

20. The system of claim 19, wherein the at least one processor or at least one processor core is further to:
cluster multiple pins of the plurality of pins to form a single pin.

21. The system of claim 20, wherein the at least one processor or at least one processor core is further to:
determine or identify a routing topology based at least in part upon a characteristic of the first pin and the second pin of the plurality of pins.

22. The system of claim 19, wherein the at least one processor or at least one processor core is further to:
strap the first interconnect for the first pin and a second interconnect for the second pin at an intersection of the first interconnect and the second interconnect.

23. The system of claim 19, wherein the at least one processor or at least one processor core is further to:
identify a blockage in the region of interest; and
determine whether the blockage can be modified.

24. The system of claim 20, wherein the at least one processor or the at least one processor core that is to cluster the multiple pins is further to:
identify a threshold requirement of proximity between two adjacent pins of the multiple pins;
identify the multiple pins based at least in part upon the threshold requirement of proximity; and
cluster the multiple pins into the single pin based at least in part upon an area match or a boundary match.

25. The system of claim 19, wherein the at least one processor or at least one processor core is further to:
determine or identify one or more first valid intervals for the region of interest.

26. The system of claim 25, wherein the at least one processor or at least one process core is further to:
generate a first set of spacetiles by at least performing a spacetile punch for the region of interest;
identify a first boundary of the region of interest based at least in part upon the first pin or the second pin; and
identify or determine the one or more first valid intervals with respect to the first boundary based at least in part upon analyzing at least some of the first set of spacetiles.

27. An article of manufacture comprising a non-transitory computer accessible storage medium having stored thereupon a sequence of instructions which, when executed by at least one processor or at least one processor core executing one or more threads, causes the at least one processor or the at least one processor core to perform a method for implementing high current carrying interconnects in an electronic design, the method comprising:
using the at least one processor or the at least one processor core of an electronic design automation (EDA) system to perform a process, the process comprising:
identifying a first pin and a second pin of a plurality of pins in the electronic design;
determining or identifying an available area for interconnecting the first pin and the second pin by analyzing a region of interest; and
implementing a first interconnect for the first pin based at least in part upon a first strand number for the first interconnect used to connect the first pin and the second pin and an electric current requirement, rather than upon changing a width of the first interconnect for the first pin.

28. The article of manufacture of claim 27, wherein the act of implementing the first interconnect comprises:
performing an area-based search using at least one spacetile of a first set of spacetiles to identify a first routing solution from the first pin; and
implementing the first interconnect for the first pin by using at least the first routing solution.

29. The article of manufacture of claim 28, wherein the process further comprises:
identifying a second strand number for the second pin;
determining whether the first set of spacetiles is to be used to implement a second interconnect for the second pin;
generating a second set of spacetiles by at least performing a spacetile punch for the region of interest where the first set of spacetiles is determined not to be used to implement the second interconnect for the second pin;
performing the area-based search by using at least the first set of spacetiles or the second set of spacetiles to generate a second routing solution for the second pin; and
implementing the second interconnect for the second pin by using at least the second routing solution.

\* \* \* \* \*